United States Patent
Ishibashi

(10) Patent No.: US 10,453,708 B2
(45) Date of Patent: Oct. 22, 2019

(54) CLEANING DEVICE AND ROLL CLEANING MEMBER

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 342 days.

(21) Appl. No.: 15/322,480

(22) PCT Filed: Jul. 1, 2015

(86) PCT No.: PCT/JP2015/003314
§ 371 (c)(1),
(2) Date: Dec. 28, 2016

(87) PCT Pub. No.: WO2016/002219
PCT Pub. Date: Jan. 7, 2016

(65) Prior Publication Data
US 2017/0170034 A1 Jun. 15, 2017

(30) Foreign Application Priority Data

Jul. 4, 2014 (JP) .................................. 2014-138685
Jun. 29, 2015 (JP) ................................ 2015-129639

(51) Int. Cl.
*B08B 11/02* (2006.01)
*H01L 21/67* (2006.01)
(Continued)

(52) U.S. Cl.
CPC ........ *H01L 21/67046* (2013.01); *A46B 13/00* (2013.01); *A46B 13/001* (2013.01);
(Continued)

(58) Field of Classification Search
CPC ......... H01L 21/67046; H01L 21/67051; A46B 13/001; B08B 11/02
See application file for complete search history.

(56) References Cited

U.S. PATENT DOCUMENTS

| 6,299,698 B1 | 10/2001 | Emami et al. |
| 2003/0005537 A1 | 1/2003 | Mihara et al. |

(Continued)

FOREIGN PATENT DOCUMENTS

| CN | 1341045 A | 3/2002 |
| CN | 102792424 A | 11/2012 |

(Continued)

OTHER PUBLICATIONS

Japanese Patent Office, International Search Report in International Patent Application No. PCT/JP2015/003314 (dated Aug. 18, 2015).
(Continued)

*Primary Examiner* — Randall E Chin
(74) *Attorney, Agent, or Firm* — Leydig, Voit & Mayer, Ltd.

(57) ABSTRACT

The present invention prevents or alleviates cleaning unevenness in cleaning of a substrate with the use of a roll cleaning member having protruding members. The roll cleaning device includes: a substrate support member that supports and rotates a substrate W; and an upper roll cleaning member (52) for scrub cleaning a surface of the substrate W which is rotated by the substrate support member, while rotating. The upper roll cleaning member (52) has a plurality of protruding members provided thereon that are arrayed in the longitudinal direction thereof, and slidably contact the surface of the substrate W. The roll cleaning device cleans the substrate W so that the trajectories of high cleaning force regions out of the parts of the protruding members which slidably contact the substrate W are present without a gap in a radial direction of the substrate W.

8 Claims, 20 Drawing Sheets

(51) Int. Cl.
*B08B 1/00* (2006.01)
*B08B 1/04* (2006.01)
*B08B 3/08* (2006.01)
*B08B 3/10* (2006.01)
*H01L 21/68* (2006.01)
*H01L 21/687* (2006.01)
*A46B 13/00* (2006.01)
*H01L 21/02* (2006.01)

(52) U.S. Cl.
CPC ............... *B08B 1/001* (2013.01); *B08B 1/04* (2013.01); *B08B 3/08* (2013.01); *B08B 3/10* (2013.01); *B08B 11/02* (2013.01); *H01L 21/67051* (2013.01); *H01L 21/68* (2013.01); *H01L 21/68714* (2013.01); *H01L 21/02074* (2013.01); *H01L 21/02096* (2013.01)

(56) References Cited

U.S. PATENT DOCUMENTS

| | | | |
|---|---|---|---|
| 2005/0109371 A1* | 5/2005 | Sin | B08B 1/04 134/6 |
| 2006/0276108 A1* | 12/2006 | Benson | A46B 13/008 451/41 |
| 2010/0043160 A1* | 2/2010 | Chen | H01L 21/67046 15/102 |
| 2011/0209727 A1 | 9/2011 | Wang et al. | |
| 2013/0048018 A1 | 2/2013 | Wargo et al. | |

FOREIGN PATENT DOCUMENTS

| | | |
|---|---|---|
| JP | 2000-270929 A | 10/2000 |
| JP | 2006-075718 A | 3/2006 |
| JP | 2008-311481 A | 12/2008 |
| JP | 2009-066527 A | 4/2009 |
| JP | 2011-181644 A | 9/2011 |
| JP | 2011-233646 A | 11/2011 |

OTHER PUBLICATIONS

The State Intellectual Property Ofice of People'S Republic of China, The First Office Action in CN Application No. 201580036679.2 (dated Apr. 28, 2019).

* cited by examiner

CLEANING DEVICE AND ROLL CLEANING MEMBER

RELATED APPLICATION

This patent application is the U.S. national phase of International Patent Application No. PCT/JP2015/003314, filed Jul. 1, 2015, which claims the benefit of Japanese Patent Application No. 2014-138685 filed in Japan on Jul. 4, 2014 and Japanese Patent Application No. 2015-129639 filed in Japan on Jun. 29, 2015, the contents of which shall be hereby incorporated by quotation herein.

TECHNICAL FIELD

This technology relates to a roll cleaning member which comes in contact with the surface of a substrate and cleans the substrate, and a cleaning device provided with the roll cleaning member.

BACKGROUND ART

When a semiconductor substrate is manufactured, films of various materials having different physical properties are formed on the substrate and are processed. For instance, in a step of forming damascene wiring, which fills a wiring groove that has been formed on the substrate, with metal, a polishing step of polishing and removing an excessive metal with a substrate polishing device (CMP) is executed after the damascene wiring has been formed. After this polishing step has ended, foreign materials such as a slurry residue and a polished Cu chip which have been used in the CMP polishing remain on the surface of the substrate. Therefore, in the CMP, in order to remove these foreign materials, a cleaning step is provided.

If the cleaning in the CMP is not sufficient and the foreign materials have remained, it can be a problem in reliability that leakage occurs from the portion thereof or the portion becomes a cause of poor adhesiveness. Furthermore, along with a miniaturization of a recent semiconductor device, a requirement for cleaning also rises, and specifically, even an existence of a smaller foreign material becomes not allowed.

There are various methods as methods for cleaning the substrate, and as one method among the methods, there is scrub cleaning of relatively moving a cleaning member and the substrate in a state in which the cleaning member has been brought into contact with the surface of the substrate, and thereby cleaning the surface of the substrate. Furthermore, the roll cleaning is known as the scrub cleaning, which uses a roll cleaning member. In the roll cleaning, for instance, the substrate is rotated that has been made wet with a chemical liquid, the roll cleaning member such as a roll sponge and a roll brush, which is columnar and extends in a long shape, is rubbed against the surface of the substrate, while being rotated, and cleans the surface of the substrate.

Also in this roll cleaning member, various types of roll cleaning members are adopted according to an object of cleaning and/or characteristics of particles (size, physical properties and the like) to be removed. As one of the members, there is a roll cleaning member having a plurality of nodules (hereinafter referred to also as "protruding member") formed on the surface thereof.

SUMMARY OF INVENTION

However, in the roll cleaning that uses the roll cleaning member having the plurality of nodules on the surface thereof, there is a problem described below. FIG. 1 is a schematic view of a cleaning device (hereinafter referred to as "roll cleaning device") provided with the roll cleaning member. The roll cleaning device 50 includes: a plurality (4 in FIG. 1) of spindles 51 that support a circumferential portion of a substrate W with the surface facing upward and horizontally rotate the substrate W; an upper roll cleaning member (roll sponge) 52 that is rotatably supported by a not-shown roll holder; and a lower roll cleaning member (roll sponge) 53 that is rotatably supported by a not-shown roll holder.

The upper roll cleaning member 52 and the lower roll cleaning member 53 are columnar, and are formed from PVA, for instance. The plurality of nodules are formed on the surface of the upper roll cleaning member 52.

Incidentally, the upper roll cleaning member 52 can be moved up and down freely with respect to the surface of the substrate W by the roll holder, and the lower roll cleaning member 53 can be moved up and down freely with respect to the rear face of the substrate W by the roll holder. In addition, the spindles 51 can be moved freely in a horizontal direction.

The upper roll cleaning member 52 rotates as is shown by an arrow of F1, by a not-shown driving mechanism, and the lower roll cleaning member 53 rotates as is shown by an arrow of F2, by a not-shown driving mechanism. Two cleaning liquid supply nozzles 54 and 55 that supply cleaning liquids onto the surface of the substrate W are arranged so as to be positioned above the substrate W which the spindles 51 support and rotate. The cleaning liquid supply nozzle 54 is a nozzle that supplies a rinse liquid (for instance, ultrapure water) onto the surface of the substrate W, and the cleaning liquid supply nozzle 55 is a nozzle that supplies a chemical liquid onto the surface of the substrate W.

The roll cleaning device 50 positions the circumferential portion of the substrate W in fitting grooves that are formed on outer peripheral side faces of tops 51a which have been provided above the spindles 51, pushes the circumferential portion of the substrate W to the inside, rotates (rotates) the tops 51a, and thereby horizontally rotates the substrate W. In this example, the two tops 51a out of the four tops 51a give a rotational force to the substrate W, and the other two tops 51a act as a bearing which receives the rotation of the substrate W. Incidentally, it is also acceptable to connect all of the tops 51a to a driving mechanism, and impart the rotational force to the substrate W.

In a state in which the roll cleaning device has horizontally rotated the substrate W, while supplying the rinse liquid onto the surface of the substrate W from the cleaning liquid supply nozzle 54 and supplying the chemical liquid onto the surface of the substrate W from the cleaning liquid supply nozzle 55, the roll cleaning device moves the upper roll cleaning member 52 down while rotating the upper roll cleaning member 52, brings the upper roll cleaning member 52 into contact with a surface of a rotating substrate W, and thereby scrub cleans the surface of the substrate W with the upper roll cleaning member 52 in the presence of the cleaning liquids (rinse liquid and chemical liquid). The length of the upper roll cleaning member 52 is set so as to be slightly longer than a diameter of the substrate W. In addition, the upper roll cleaning member 52 is arranged so that the central axis (rotary shaft) thereof is approximately perpendicular to the central axis (specifically, center of rotation) of the substrate W, and extends over the whole length of the diameter of the substrate W. Thereby, the whole surface of the substrate W is cleaned at the same time.

FIG. 2 is a view showing an arrangement example of the nodules on the upper roll cleaning member 52. A direction from left to right in FIG. 2 corresponds to a longitudinal direction (hereinafter referred to as "row direction" as well) of the upper roll cleaning member 52, and a direction from top to bottom in FIG. 2 corresponds to a circumferential direction (direction vertical to longitudinal direction) of the upper roll cleaning member 52. As shown in FIG. 2, in two adjacent rows, the positions of the nodules deviate from each other. When the upper roll cleaning member 52 and the surface of the substrate W relatively move, theoretically, the heads of the nodules and the surface of the substrate W come in contact with each other in hatched portions, and the upper roll cleaning member 52 can clean the surface of the substrate W so that there is no gap in the row direction (longitudinal direction of roll cleaning member).

However, actually, in the cleaning, cleaning unevenness results in occurring in the longitudinal direction of the upper roll cleaning member 52, in other words, in a radial direction of the surface of the substrate W. FIG. 3 is a cross-sectional view showing a state in which the nodules on the upper roll cleaning member 52 contacts the surface of the substrate W. As are shown in FIG. 3, nodules n1 to n5 are formed into a column shape, and a head face n41 has a circular shape, but the nodule n3 which comes in contact with the surface of the substrate W is squashed by the surface of the substrate W and is further deformed by relative movement of the nodules and the surface of the substrate W, and the head face n31 becomes an ellipse shape. In addition, a stress concentrates on a middle portion (hatched portion in FIG. 3) in the upstream side of this contact surface, the nodules come in contact with the surface of the substrate W in this portion with a strong pressing force, and the cleaning force becomes strong there. FIG. 4 is a view showing a result of measurement of a pressure distribution on the head of a squashed nodule. It can be understood from the measurement result in FIG. 4 that a high cleaning force region in which the cleaning force becomes high surely exists in the middle portion in the upstream side of the contact surface. In this example of FIG. 4, the width in the row direction of the highly cleaned region is approximately 44% of the width of the nodule.

When the highly cleaned regions are viewed from the longitudinal direction of the upper roll cleaning member 52, the regions (hatched portions in FIG. 5) that are cleaned with a high cleaning force are formed into strip shapes which are spaced from each other, as are shown in FIG. 5. If the substrate is cleaned with the use of the roll cleaning member while being rotated, the regions which are cleaned with the high cleaning force are formed into spaced strip shapes, and thereby concentric cleaning unevenness results in being formed on the surface of the substrate, as is shown in FIG. 6.

The present technology is designed with respect to the above described problem, and the object is to prevent or alleviate cleaning unevenness in the cleaning of a substrate with the use of a roll cleaning member having nodules.

A cleaning device of a first aspect has a structure including: a substrate support member that supports and rotates a substrate, and a roll cleaning member for scrub cleaning a surface of the substrate which is rotated by the substrate support member, while rotating, wherein the roll cleaning member has a plurality of protruding members provided thereon which are arrayed in the longitudinal direction thereof, and slidably contact the surface of the substrate, and cleans the substrate so that the trajectories of high cleaning force regions out of the parts of the protruding members which come in slidable contact with the substrate are present without a gap in a radial direction of the substrate.

Due to this structure, the substrate is cleaned so that the high cleaning force regions of the protruding members are present without a gap in the radial direction of the substrate, and accordingly the cleaning device can alleviate or prevent concentric cleaning unevenness that occurs on the substrate.

The width of the high cleaning force region may be set at any width of 30% to 60% of a contact region between the protruding member and the surface of the substrate.

The high cleaning force regions may be determined on the basis of cleaning unevenness that occurs when the substrate has been actually cleaned, or may be determined so that a predetermined ratio of the contact region between the protruding member and the surface of the substrate is set as the high cleaning force region, as has been described above, and the trajectories of the high cleaning force regions are present without a gap in the radial direction of the substrate.

The plurality of protruding members may be arranged at even intervals in the longitudinal direction of the roll cleaning member to form a plurality of protruding member rows; and positions of the plurality of protruding members in the adjacent protruding member rows in the circumferential direction of the roll cleaning member may deviate from each other only by a half of the pitches of the protruding members in the protruding member rows.

Due to this structure, the protruding members can be arranged in a staggered form.

There may be gaps each in the radial direction between the plurality of the trajectories when the high cleaning force regions of the plurality of protruding members have come in slidable contact with the substrate; and the cleaning device makes the roll cleaning member and a rotating substrate relatively oscillate during cleaning, and thereby may clean the substrate so that the plurality of trajectories of the high cleaning force regions are present without a gap in the radial direction of the substrate.

Due to this structure, the positions of the roll cleaning member and the substrate relatively change, and accordingly even when there is a gap between the trajectories of the highly cleaned regions, the cleaning device can reduce or eliminate this gap.

When a pitch of the plurality of protruding members in the protruding member row is represented by np and the width in the longitudinal direction of the high cleaning force region is represented by sa, a oscillation pitch sp of the roll cleaning member may satisfy a relationship of $sp \geq (np/2) - sa$.

Due to this structure, the gap between the trajectories of the high cleaning force regions on the substrate can be eliminated by the oscillation of the roll cleaning member.

The cleaning device may have the two roll cleaning members that include a first roll cleaning member and a second roll cleaning member: and in the first roll cleaning member and the second roll cleaning member, the plurality of protruding members may be arranged at even intervals in the longitudinal directions of the roll cleaning members and may form a plurality of protruding member rows, and the positions of the plurality of protruding members in the protruding member rows adjacent to each other in the circumferential direction of the roll cleaning member may deviate from each other only by a half of the pitch of the protruding members in the protruding member rows.

Due to this structure, the other roll cleaning member can clean the substrate so as to reduce or eliminate cleaning unevenness which has occurred by one roll cleaning member.

In the first roll cleaning member and the second roll cleaning member, when the pitches of the protruding members in the protruding member rows are represented by np, the positions of the plurality of protruding members of the first roll cleaning member at the time when cleaning the substrate and the positions of the plurality of protruding members of the second roll cleaning member at the time when cleaning the substrate may deviate from each other only by np/4 in the row direction.

Due to this structure, the middles of the high cleaning force regions in the second roll cleaning member can be positioned in the middles of the gaps between the trajectories of the high cleaning force regions in the first roll cleaning member.

The plurality of protruding members may include a plurality of protruding members that are aligned at a pitch np in a first row of the longitudinal direction, a plurality of protruding members that are aligned at the pitch np in a second row of the longitudinal direction, a plurality of protruding members that are aligned at the pitch np in a third row of the longitudinal direction, and a plurality of protruding members that are aligned at the pitch np in a fourth row of the longitudinal direction; and the positions of the plurality of protruding members in the longitudinal direction, which are aligned in the first row, and the positions of the plurality of protruding members in the longitudinal direction, which are aligned in the second row, deviate from each other only by np/4, the positions of the plurality of protruding members in the longitudinal direction, which are aligned in the second row, and the positions of the plurality of protruding members in the longitudinal direction, which are aligned in the third row, may deviate from each other only by np/4, and the positions of the plurality of protruding members in the longitudinal direction, which are aligned in the third row, and the positions of the plurality of protruding members in the longitudinal direction, which are aligned in the fourth row, may deviate from each other only by np/4.

Due to this structure, the middle of the trajectory of the high cleaning force region by the protruding member of the second row and the trajectory of the high cleaning force region by the protruding member of the fourth row can be positioned in the middle of a gap between the trajectory of the high cleaning force region by the protruding member of the first row and the trajectory of the high cleaning force region by the protruding member of the third row.

The roll cleaning member may come in slidable contact with the substrate in a range that passes the rotation center of a rotating substrate and reaches the outer peripheries of the substrate on both sides from the rotation center, and the plurality of protruding members may be asymmetrically arranged on both sides with reference to the position corresponding to the rotation center.

Due to this structure, the high cleaning force regions by the protruding members existing in one side than the reference position in the longitudinal direction of the roll cleaning member and the high cleaning force regions by the protruding members existing in the other side deviate from each other, and the cleaning device can prevent or alleviate the cleaning unevenness.

As for the plurality of protruding members, distances between the position corresponding to the rotation center and the plurality of protruding members in one side in the longitudinal direction than the position corresponding to the rotation center, and distances between the position corresponding to the rotation center and the plurality of protruding members in the other side in the longitudinal direction than the position corresponding to the rotation center may deviate from each other only by np/4.

The middles of the trajectories of the high cleaning force regions by the protruding members in the other side than the reference position in the longitudinal direction of the roll cleaning member can be positioned in the middles of the gaps between the trajectories of the high cleaning force regions by the protruding members in one side.

A cleaning device of a second aspect has a structure including: a substrate support member that supports and rotates a substrate; and a roll cleaning member for scrub cleaning a surface of the substrate which is rotated by the substrate support member, while rotating, wherein the roll cleaning member has a plurality of protruding members provided thereon that are arrayed at even intervals in the longitudinal direction thereof, and slidably contact the surface of the substrate: the plurality of protruding members are arranged in the longitudinal direction of the roll cleaning member to form a plurality of protruding member rows, and positions of the plurality of protruding members in the protruding member rows which are adjacent to each other in the circumferential direction of the roll cleaning member deviate from each other only by a half of the pitch of the protruding members in the protruding member rows; there are mutual gaps between the trajectories of the high cleaning force regions at the time when the high cleaning force regions of the plurality of protruding members have come in slidable contact with the substrate; and the cleaning device relatively oscillates the roll cleaning member and the substrate that is rotated by the substrate support member during cleaning.

Due to this structure, the positions of the roll cleaning member and the substrate relatively change, and accordingly even when there is a gap between the trajectories of the highly cleaned regions, the cleaning device can reduce or eliminate this gap.

A cleaning device of a third aspect has a structure including: a substrate support member that supports and rotates a substrate; and a first roll cleaning member for scrub cleaning a surface of the substrate which is rotated by the substrate support member, while rotating, and a second roll cleaning member for scrub cleaning the surface of the substrate which is rotated by the substrate support member, wherein the first roll cleaning member and the second roll cleaning member are each arrayed in the longitudinal direction and have a plurality of protruding members that come in slidable contact with the surface of the substrate; and in the first roll cleaning member and the second roll cleaning member, the plurality of protruding members are arranged at even intervals in the longitudinal directions of the roll cleaning members to form a plurality of protruding member rows, and positions of the plurality of protruding members of the protruding member rows which are adjacent to each other in the circumferential direction of the roll cleaning member deviate from each other only by a half of the pitch of the protruding members in the protruding member rows.

Due to this structure, the other roll cleaning member can clean the substrate so as to reduce or eliminate cleaning unevenness which has occurred by one roll cleaning member.

A cleaning device of a fourth aspect has a structure including: a substrate support member that supports and rotates a substrate; and a roll cleaning member for scrub cleaning a surface of the substrate which is rotated by the substrate support member, while rotating, wherein the roll cleaning member has a plurality of protruding members provided thereon which are arrayed in the longitudinal direction thereof, and slidably contact the surface of the substrate, and the plurality of protruding members include a plurality of protruding members that are aligned at a pitch np in a first row of the longitudinal direction, a plurality of protruding members that are aligned at the pitch np in a second row of the longitudinal direction, a plurality of protruding members that are aligned at the pitch np in a third row in the longitudinal direction, and a plurality of protruding members that are aligned at the pitch np in a fourth row of the longitudinal direction, wherein the positions of the plurality of protruding members in the longitudinal direction, which are aligned in the first row, and the positions of the plurality of protruding members in the longitudinal direction, which are aligned in the second row, deviate from each other only by np/4, the positions of the plurality of protruding members in the longitudinal direction, which are aligned in the second row, and the positions of the plurality of protruding members in the longitudinal direction, which are aligned in the third row, deviate from each other only by np/4, and the positions of the plurality of protruding members in the longitudinal direction, which are aligned in the third row, and the positions of the plurality of protruding members in the longitudinal direction, which are aligned in the fourth row, deviate from each other only by np/4.

Due to this structure, the middles of the trajectory of the high cleaning force region by the protruding member of the second row and the trajectory of the high cleaning force region by the protruding member of the fourth row can be positioned in the middle of a gap between the trajectory of the high cleaning force region by the protruding member of the first row and the trajectory of the high cleaning force region by the protruding member of the third row.

A cleaning device of a fifth aspect has a structure including: a substrate support member that supports and rotates a substrate; and a roll cleaning member for scrub cleaning a surface of the substrate which is rotated by the substrate support member, while rotating, wherein the roll cleaning member has a plurality of protruding members provided thereon which are arrayed in the longitudinal direction thereof, and slidably contact the surface of the substrate; and the roll cleaning member slidably contacts the substrate in a range that passes the rotation center of a rotating substrate and reaches the outer peripheries of the substrate on both sides from the rotation center, and the plurality of protruding members are asymmetrically arranged on both sides of a boundary with reference to the position corresponding to the rotation center.

Due to this structure, the high cleaning force regions by the protruding members existing in one side than the reference position in the longitudinal direction of the roll cleaning member and the high cleaning force regions by the protruding members existing in the other side deviate from each other, and the cleaning device can prevent or alleviate the cleaning unevenness.

A cleaning device of a sixth aspect has a structure including: a substrate support member that supports and rotates a substrate; and a roll cleaning member for scrub cleaning a surface of the substrate which is rotated by the substrate support member, while rotating, wherein the roll cleaning member has a plurality of protruding members provided thereon which are arrayed in the longitudinal direction thereof, and slidably contact the surface of the substrate, and the plurality of protruding members are arranged in the longitudinal direction of the roll cleaning member to form a plurality of protruding member rows, and positions of the plurality of protruding members in the protruding member rows which are adjacent to each other in the circumferential direction of the roll cleaning member deviate from each other in the longitudinal direction; and as for the roll cleaning member, the plurality of protruding members in the protruding member rows which are adjacent to each other in the circumferential direction partially overlap each other in the circumferential direction, on a basic surface on which the protruding members are provided so as to protrude, and the plurality of protruding members in the protruding member rows which are adjacent to each other in the circumferential direction are separated from each other in the circumferential direction, on the contact surface of the protruding members.

Due to this structure, continuous strip-like thin-walled portions are not formed because the protruding members become staggered in the longitudinal direction and partially overlap in the circumferential direction, on the basic surface of the roll cleaning member, and the deterioration of the thin-walled portion can be alleviated, which is caused by a slidable contact of the protruding members with the substrate. In addition, the protruding members are separated from each other in the circumferential direction on the contact surface of the roll cleaning member, and accordingly flowability of the cleaning liquid can be secured.

A roll cleaning member of a first aspect is a roll cleaning member for scrub cleaning a surface of a rotating substrate while rotating, and has a structure including: a plurality of protruding members that are arrayed in the longitudinal direction of the roll cleaning member and slidably contact the surface of the substrate, wherein the plurality of protruding members include a plurality of protruding members that are aligned at a pitch np in a first row of the longitudinal direction, a plurality of protruding members that are aligned at the pitch np in a second row of the longitudinal direction, a plurality of protruding members that are aligned at the pitch np in a third row of the longitudinal direction, and a plurality of protruding members that are aligned at the pitch np in a fourth row of the longitudinal direction; and the positions of the plurality of protruding members in the longitudinal direction, which are aligned in the first row, and the positions of the plurality of protruding members in the longitudinal direction, which are aligned in the second row, deviate from each other only by np/4, the positions of the plurality of protruding members in the longitudinal direction, which are aligned in the second row, and the positions of the plurality of protruding members in the longitudinal direction, which are aligned in the third row, deviate from each other only by np/4, and the positions of the plurality of protruding members in the longitudinal direction, which are aligned in the third row, and the positions of the plurality of protruding members in the longitudinal direction, which are aligned in the fourth row, deviate from each other only by np/4.

Due to this structure, the middles of a trajectory of the high cleaning force region by a protruding member of the second row and a trajectory of the high cleaning force region by a protruding member of the fourth row can be positioned in the middle of a gap between a trajectory of the high cleaning force region by a protruding member of the first row and a trajectory of the high cleaning force region by a protruding member of the third row.

A roll cleaning member of a second aspect is a roll cleaning member for scrub cleaning a surface of a rotating substrate while rotating, and has a structure including: a plurality of protruding members that are arrayed in the longitudinal direction of the roll cleaning member and slidably contact the surface of the substrate, wherein the roll cleaning member slidably contacts the substrate in a range that passes the rotation center of the rotating substrate and reaches the outer peripheries of the substrate on both sides from the rotation center, and the plurality of protruding members are asymmetrically arranged on both sides of a boundary with reference to the position corresponding to the rotation center.

Due to this structure, the high cleaning force regions by the protruding members existing in one side than the reference position in the longitudinal direction of the roll cleaning member and the high cleaning force regions by the protruding members existing in the other side deviate from each other, and the cleaning device can prevent or alleviate the cleaning unevenness.

A roll cleaning member of a third aspect is a roll cleaning member for scrub cleaning a surface of a rotating substrate while rotating, and has a structure including: a plurality of protruding members that are arrayed in the longitudinal direction of the roll cleaning member and slidably contact the surface of the substrate, wherein the plurality of protruding members are arranged in the longitudinal direction of the roll cleaning member to form a plurality of protruding member rows, and positions of the plurality of protruding members in the protruding member rows which are adjacent to each other in the circumferential direction of the roll cleaning member deviate from each other in the longitudinal direction; and as for the roll cleaning member, the plurality of protruding members in the protruding member rows which are adjacent to each other in the circumferential direction partially overlap each other in the circumferential direction, on a basic surface on which the protruding members are provided so as to protrude, and the plurality of protruding members in the protruding member rows which are adjacent to each other in the circumferential direction are separated from each other in the circumferential direction, on the contact surface of the protruding members.

Due to this structure, continuous strip-like thin-walled portions are not formed because the protruding members become staggered in the longitudinal direction and partially overlap in the circumferential direction, on the basic surface, and the deterioration of the thin-walled portion can be alleviated, which is caused by a slidable contact of the protruding members with the substrate. In addition, the protruding members are separated from each other in the circumferential direction on the contact surface, and accordingly flowability of the cleaning liquid can be secured.

A roll cleaning member of a fourth aspect has a structure including: a plurality of protruding members provided thereon which slidably contact a surface of a substrate and have a tubular shape, wherein the plurality of protruding members are arrayed so as to form a plurality of protruding member rows that are arrayed on straight lines in the longitudinal direction of the roll cleaning member, and the protruding members that constitute the plurality of protruding member rows are arranged at positions which mutually satisfy the following relationships (1) and (2):

$$Lc > 2Rc \tag{1},$$

wherein, Lc is defined as a shortest distance between a straight line that passes through centers of circles of the plurality of protruding members that constitute a first protruding member row and a straight line that passes through centers of circles of the plurality of protruding members that constitute a second protruding member row which is adjacent to the first protruding member row in the circumferential direction, on a contact surface;

in addition, Rc is defined as an average length of radii of the plurality of protruding members that constitute the plurality of protruding member rows, on the contact surface;

$$Lb < 2Rb \tag{2},$$

wherein Lb is defined as a shortest distance between a straight line that passes through centers of circles of a plurality of protruding members that constitute a first protruding member row and a straight line that passes through centers of circles of a plurality of protruding members that constitute a second protruding member row that is adjacent to the first protruding member row in the circumferential direction, on a basic surface; and in addition, Rb is defined as an average length of radii of a plurality of protruding members that constitute a plurality of protruding member rows, on the basic surface.

Due to this structure, a continuous strip-like thin-walled portion is not formed because the distance between the protruding member rows which are adjacent to each other becomes short and the protruding member rows result in partially overlapping in the circumferential direction, on the basic surface, and the deterioration of the thin-walled portion can be alleviated, which is caused by a slidable contact of the protruding members with the substrate. In addition, the distance of the protruding member rows becomes long, which are adjacent to each other, the protruding members result in being separated from each other in the circumferential direction, on the contact surface, and accordingly flowability of the cleaning liquid can be secured.

As will be described below, other aspects exist in the present invention. Accordingly, the disclosure of this invention is intended to provide a part of the present invention, and is not intended to limit the scope of the invention, which is described here and claimed.

DESCRIPTION OF EMBODIMENTS

Figure 1:
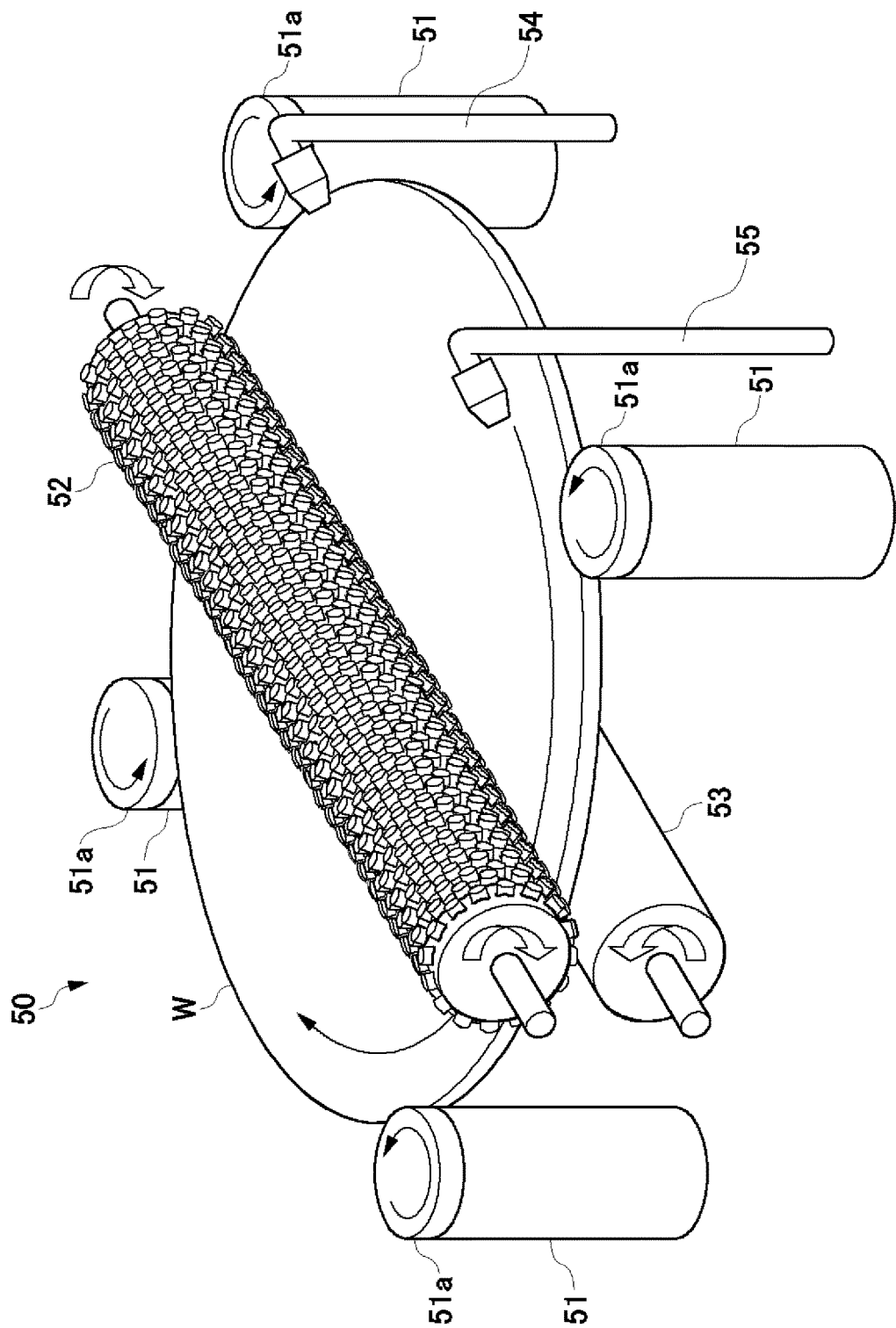
FIG. 1 is a schematic view of a cleaning device (roll cleaning device) which is provided with a roll cleaning member.
Figure 2:
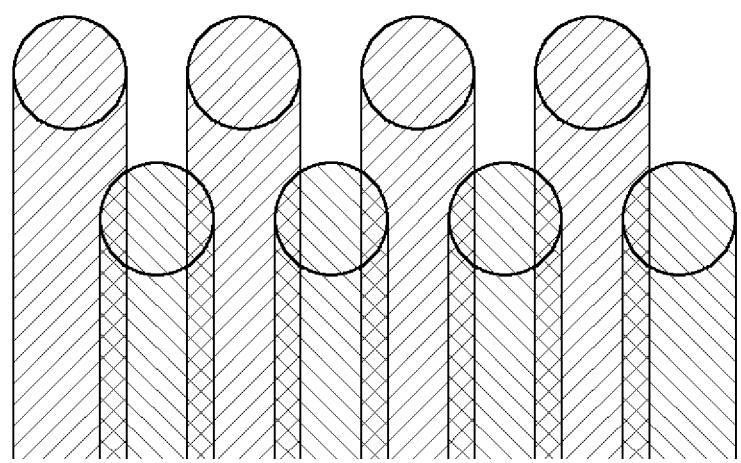
FIG. 2 is a view showing an arrangement example of nodules on an upper roll cleaning member.

The roll cleaning device in embodiments of the present technology will be described below, with reference to the drawings. Incidentally, the embodiments which will be described below show one example of the case where the present technology is carried out, and does not limit the present technology to the specific structures which will be described below. When the present technology is carried out, a specific structure according to the embodiments may be appropriately adopted. The basic structure of the roll cleaning device in the embodiments of the present technology is shown in FIG. 1, and is similar to the structure that has been described above. Hereafter, examples of the structure for preventing or alleviating the cleaning unevenness will be described.

First Embodiment

Figure 6:
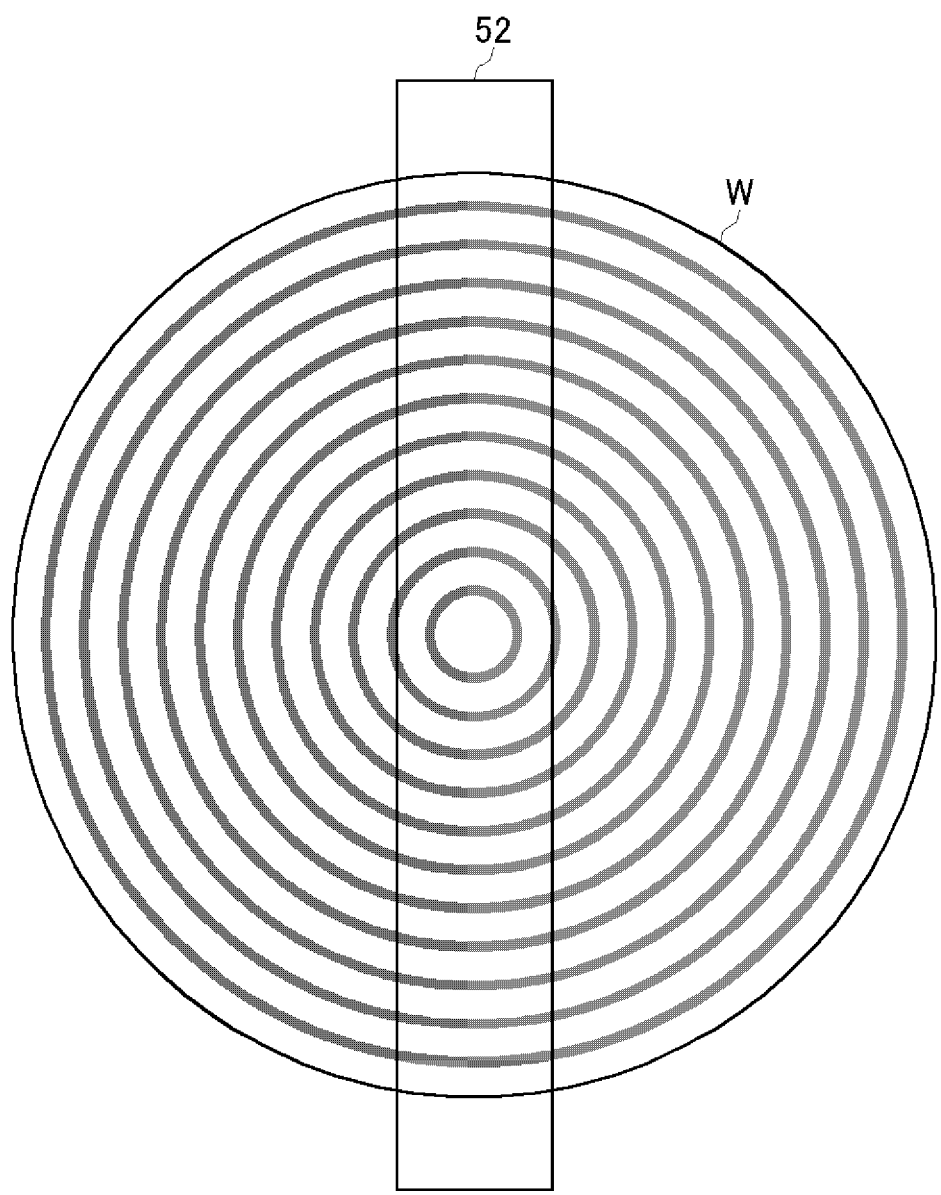
FIG. 6 is a view showing cleaning unevenness that occurs on the surface of the substrate.
Figure 7:
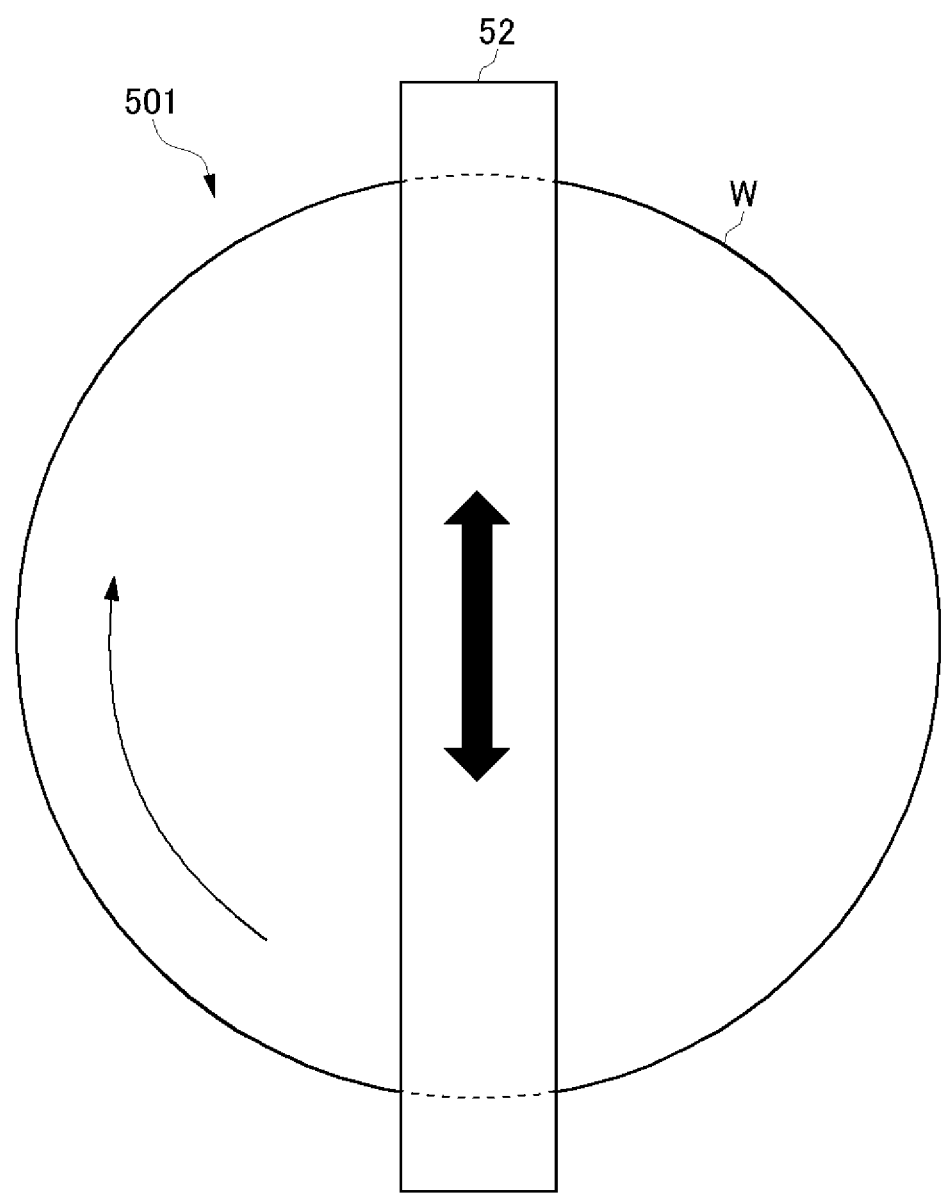
FIG. 7 is a schematic view of the roll cleaning device in a first embodiment of the present invention.

FIG. 7 is a schematic view of the roll cleaning device in a first embodiment. In FIG. 7, only a substrate W and an upper roll cleaning member 52 are shown. In a roll cleaning device 501 of the present embodiment, the upper roll cleaning member 52 is oscillated (reciprocally moved in parallel) in the axial direction, by a not-shown driving device. Thereby, the positions of the nodules (protruding members) on the upper roll cleaning member 52 in the radial direction of the substrate W are not fixed, which can prevent concentric cleaning unevenness as shown in FIG. 6.

Figure 8:
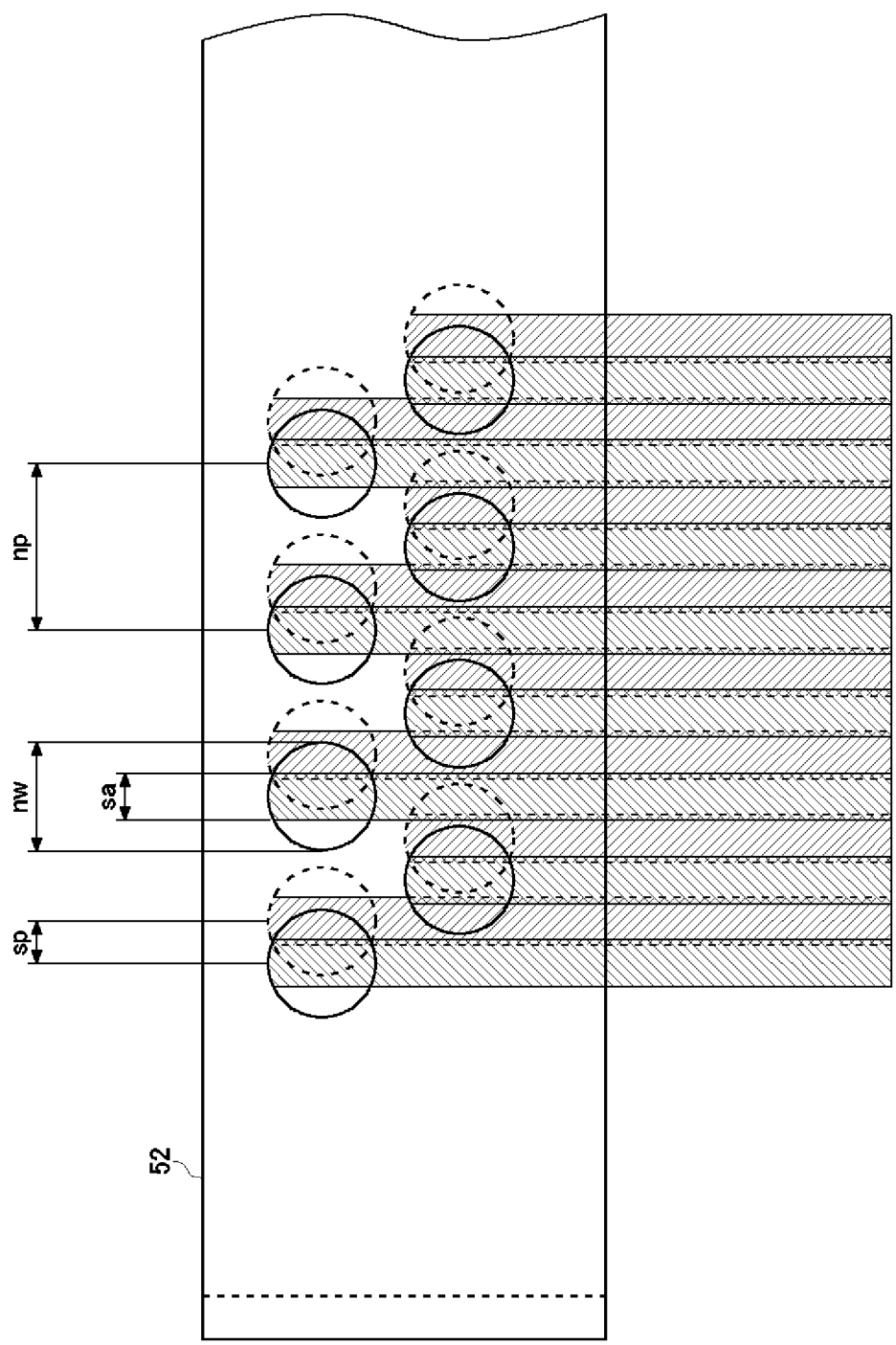
FIG. 8 is a schematic view of a structure of an upper roll cleaning member in the first embodiment of the present invention.

FIG. 8 is a schematic view showing a structure of the upper roll cleaning member 52. An oscillation pitch (repetition width) of the upper roll cleaning member 52 will be described below, with reference to FIG. 8. The upper roll cleaning member 52 has a column shape, and has a plurality of column-shaped nodules formed on the surface thereof. The plurality of nodules on the upper roll cleaning member 52 are arranged at even intervals in a row direction, and each of the rows is arranged at even intervals in a circumferential direction of the upper roll cleaning member 52. In addition, positions of nodules in a certain row and positions of nodules in a row adjacent to the row thereof deviate from each other only by a half of the space between the nodules in the row direction. Specifically, the nodules are arranged in a staggered form according to each row.

Now, when a diameter of the nodule is represented by nw, a pitch in an arrangement in the row direction of the nodules is represented by np, a width in a row direction of a region (high cleaning force region) is represented by sa, in which the nodule comes in contact with the surface of the substrate W with a high pressing force and thereby scrub cleans the surface of the substrate W with a high cleaning force, and an oscillating pitch (amplitude of reciprocal parallel movement) is represented by sp, firstly, the upper roll cleaning member 52 in the example of FIG. 8 satisfies a relationship of np−nw<nw, in other words, np<2nw. Specifically, the upper roll cleaning member 52 comes in slidable contact with the substrate W, while rotating, and accordingly the nodules result in contacting the surface of the substrate W without a gap. However, as is shown in FIG. 8, there is a gap between the trajectories of the high cleaning force regions that are adjacent in the row direction, and in this situation, cleaning unevenness results in occurring. Then, in the present embodiment, the roll cleaning member is oscillated in the longitudinal direction thereof, as has been described above.

Here, if the oscillating pitch sp has satisfied a relationship of sp≥(np/2)−sa, the trajectories of the high cleaning force regions of the nodules result in being positioned in the radial direction of the substrate W without a gap, by the oscillation of the upper roll cleaning member 52, and the concentric cleaning unevenness can be prevented. Incidentally, when a ratio of the width sa of the high cleaning force region to the diameter nw of the nodule is represented by k (in other words, sa/nw=k), a condition of the pitch np in the row direction of the nodules becomes a relationship of sp≥(np/2)−(k×nw), which is necessary for the trajectories of the high cleaning force regions to be present in the radial direction of the substrate W without a gap.

The width sa of the high cleaning force region may be determined by the setting of the k, or may also be determined on the basis of the cleaning unevenness that actually occurs. The k can be set at any value of 0.3 to 0.6. Specifically, the width sa of the high cleaning force region can be set at a width of 30% to 60% of the width (diameter of end face, when end face is circle) in the row direction of the end face of the nodule. The width sa of the high cleaning force region can be set, for instance, at 40% of the width in the row direction of the end face of the nodule. In addition, the width sa of the high cleaning force region may be determined on the basis of the cleaning unevenness that occurs when the roll cleaning member has actually cleaned the substrate.

Incidentally, in FIG. 8, each of the nodules is largely drawn as compared to the whole size of the upper roll cleaning member 52, but in FIG. 8, the ratios among the above described nw, np, sa and sp are precisely illustrated. Incidentally, in FIG. 8, only a part of the plurality of nodules that are formed on the upper roll cleaning member 52 is shown, and the illustration of the nodules of parts in the row direction and in the circumferential direction is omitted. In addition, the trajectories on the substrate W of the high cleaning force regions ought to be concentrically formed on the substrate W by the rotation of the substrate W, but in FIG. 8, the trajectories are shown by straight lines.

Figure 9:
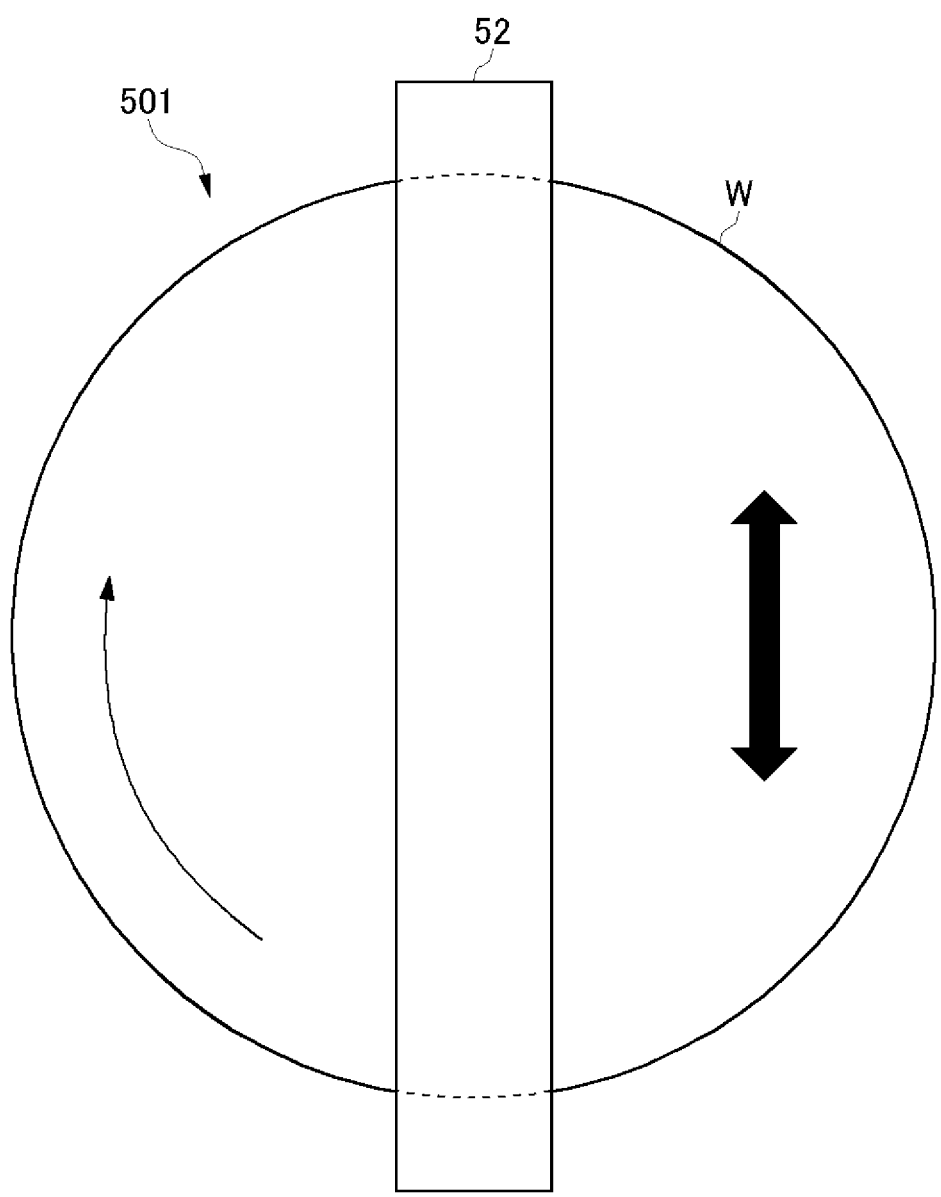
FIG. 9 is a schematic view of a modified example of the roll cleaning device in the first embodiment of the present invention.

Incidentally, in the above described embodiments, the upper roll cleaning member 52 has been oscillated in the axial direction, but instead of this method, as is shown in FIG. 9, the substrate W may be oscillated in the axial direction of the upper roll cleaning member 52. Furthermore, the upper roll cleaning member 52 may be moved reciprocally in parallel not to the axial direction but to another direction, or may be rotated and oscillated around a predetermined pivot axis perpendicular to the substrate W.

Second Embodiment

Figure 10:
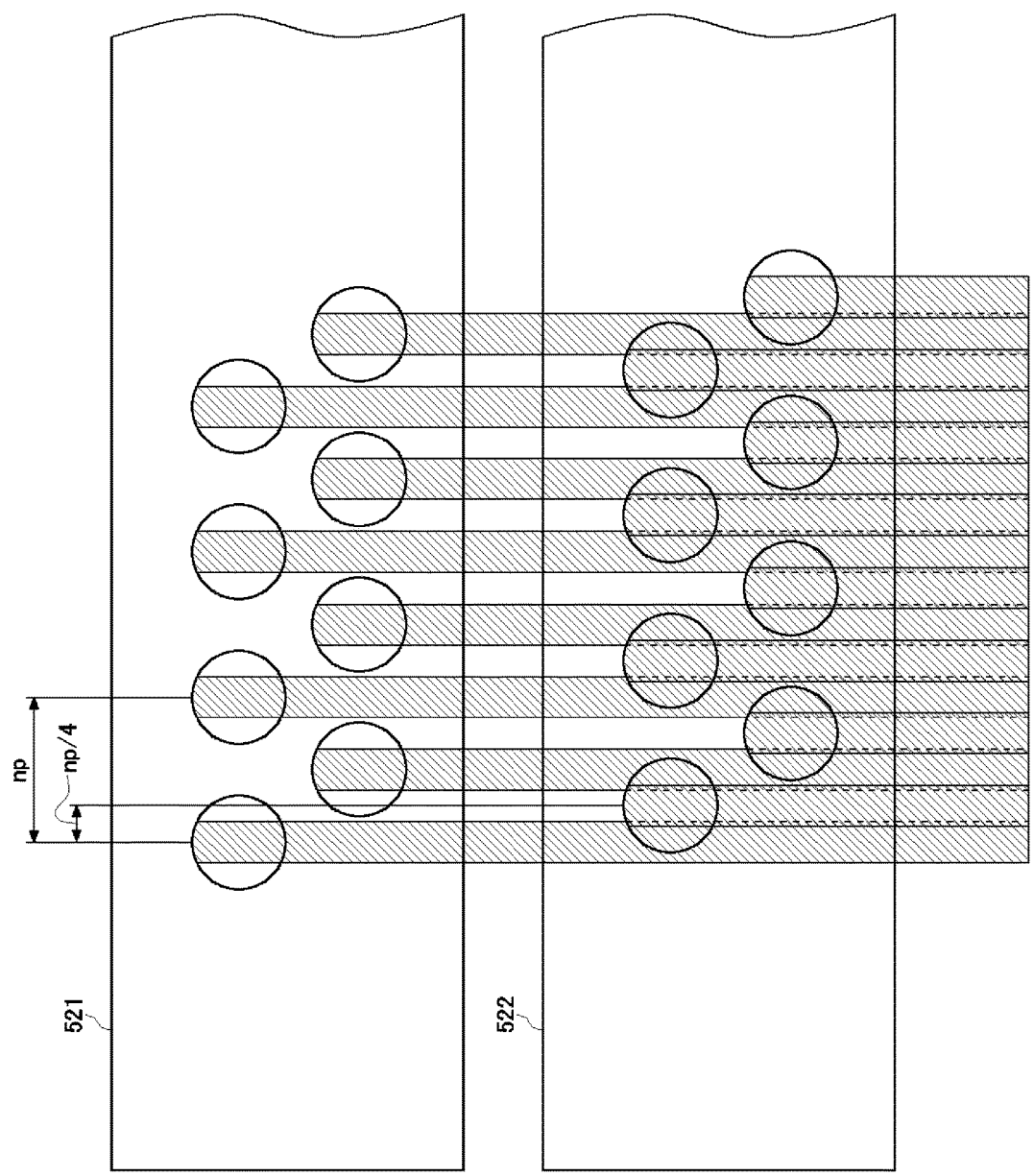
FIG. 10 is a schematic view showing a structure of an upper roll cleaning member in a second embodiment of the present invention.

FIG. 10 is a schematic view showing a structure of an upper roll cleaning member in a second embodiment. Incidentally, also in FIG. 10, each of the nodules is largely drawn as compared to the whole size of the upper roll cleaning member. In addition, also in FIG. 10, only a part of the plurality of nodules that are formed on the upper roll cleaning member is shown, and the illustration of the nodules of parts in the row direction and in the circumferential direction is omitted.

In the present embodiment, two upper roll cleaning members 521 and 522 are provided in one roll cleaning device, and the roll cleaning device scrub cleans the surface of the same substrate by sequentially or simultaneously using the upper roll cleaning members. A plurality of column-shaped nodules are formed on the first upper roll cleaning member 521 and the second upper roll cleaning member 522. The plurality of nodules on the first upper roll cleaning member 521 and the second upper roll cleaning member 522 are arranged at even intervals in the row direction, and each of the rows is arranged at even intervals in the circumferential direction. In addition, the position of the nodules in a certain row and the position of the nodules in a row adjacent to the row deviate from each other only by a half of a space (np) between the nodules in the row direction.

Furthermore, the positions of the nodules on the first upper roll cleaning member 521 and the nodules on the second upper roll cleaning member 522 deviate from each other only by ¼ (np/4) of the space (np) between the nodules in the row direction. Due to this structure, the middles of the high cleaning force regions in the second upper roll cleaning member 522 result in being positioned in the middles of the gaps between the high cleaning force regions in the first upper roll cleaning member 521. Therefore, if the high cleaning force region has the width of ¼ or more of the diameter of the nodule, when the cleaning device cleans the substrate by using the first upper roll cleaning member 521 and the second upper roll cleaning member 522, the high cleaning force region by the second upper roll cleaning member 522 is positioned in the gap between the trajectories of the high cleaning force regions by the first upper roll cleaning member 521, and the trajectories of the high cleaning force regions result in being present without a gap in a radial direction of the substrate; and the cleaning device can prevent the concentric cleaning unevenness from occurring on the substrate.

Third Embodiment

Figure 11:
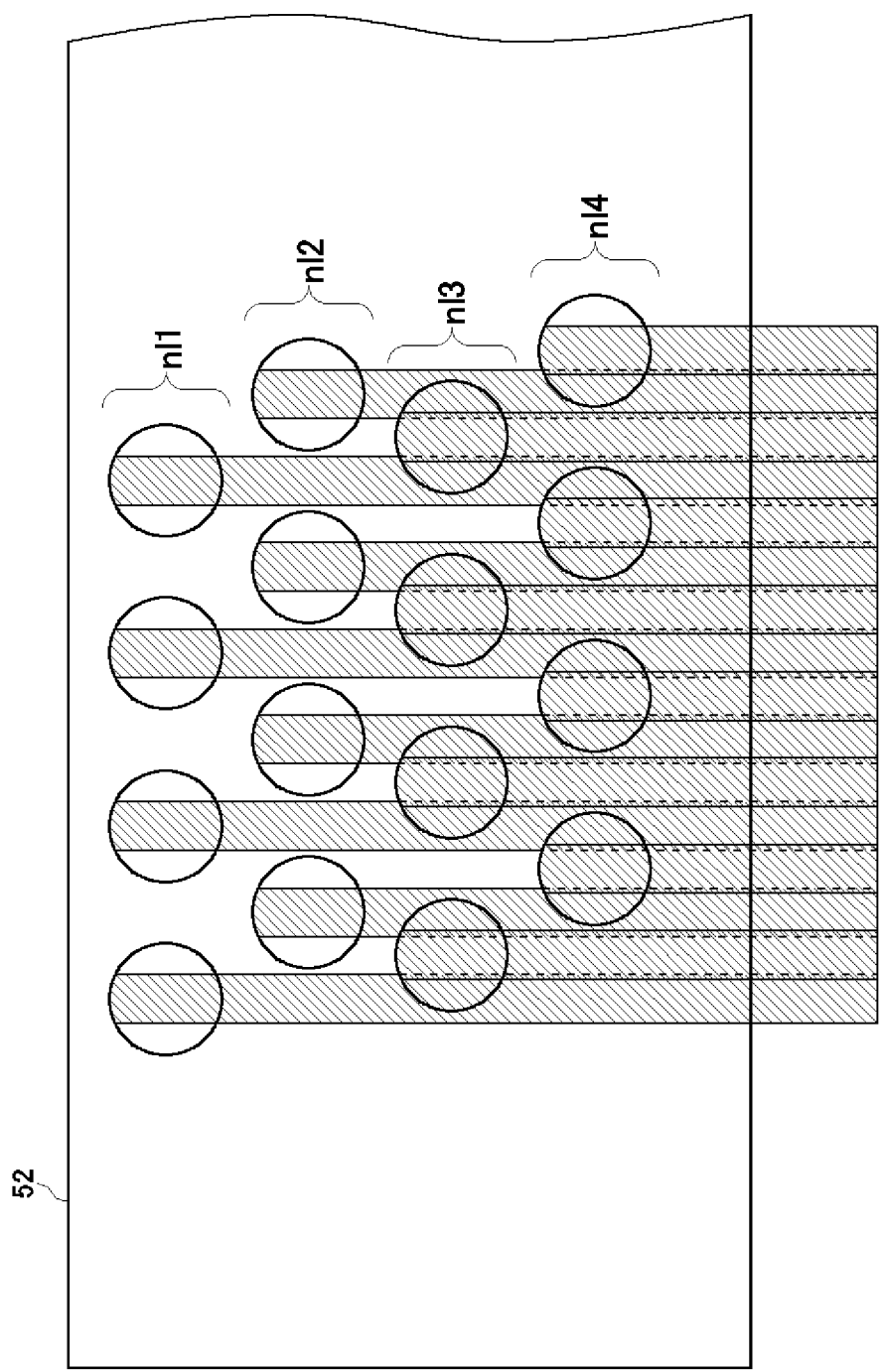
FIG. 11 is a schematic view showing a structure of an upper roll cleaning member in a third embodiment of the present invention.

FIG. 11 is a schematic view showing a structure of an upper roll cleaning member 52 in a third embodiment. Incidentally, also in FIG. 11, each of the nodules is largely drawn as compared to the whole size of the upper roll cleaning member. In addition, also in FIG. 11, only a part of the plurality of nodules that are formed on the upper roll cleaning member is shown, and the illustration of a part of the nodules in the row direction and in the circumferential direction is omitted.

A plurality of column-shaped nodules are formed on the upper roll cleaning member 52. The plurality of nodules are arranged at even intervals in the row direction, and each of the rows is arranged at even intervals in the circumferential direction. The upper roll cleaning member 52 of the present embodiment has m types of nodule rows that deviate from the positions of the nodules, which are positions of nodules in a certain row that is regarded as a reference, each by 1/m of the space (np) between the nodules in the row direction.

The k is determined in the following way from the diameter nw of the nodule, the pitch np in the arrangement in the row direction of the nodules, and the width sa of the high cleaning force region in the row direction. Specifically, a rounded-up integer of (np−sa)/sa+1 shall be represented by m. When the upper roll cleaning member 52 is structured as in the above way, all of the gaps between the high cleaning force regions of the nodules in the certain row result in being covered by the high cleaning force regions in the other rows, the trajectories of the high cleaning force regions result in being present without a gap in a radial direction of the substrate, and the cleaning device can prevent the concentric cleaning unevenness from occurring on the substrate.

In the example of FIG. 11, (np−sa)/sa+1 becomes approximately 3.64, and accordingly if m has been set at 4, the trajectories of the high cleaning force regions result in being present without a gap in the radial direction of the substrate. Therefore, the upper roll cleaning member 52 of the present embodiment has four types of rows that are: a row having a plurality of nodules that deviate from the positions of the nodules which are positions of nodules in a certain row that is regarded as a reference, only by ¼ of the space (np) between the nodules, in the row direction; a row that deviates from the row further by ¼ of the space (np) between the nodules, in the row direction; a row that deviates from the row further by ¼ of the space (np) between the nodules, in the row direction.

In the example of FIG. 11, a nodule row n11 and a nodule row n13 deviate from each other only by np/4, a nodule row n12 further deviates from the nodule row n13 only by np/4, and a nodule row n14 further deviates from the nodule row n12 only by np/4. Due to this structure, the middle of a trajectory of the high cleaning force region by a nodule of the second row and a trajectory of the high cleaning force region by a nodule of the fourth row result in being positioned in the middle of a gap between the trajectory of the high cleaning force region by the nodules of the first row and the trajectory of the high cleaning force region by the nodules of the third row, and the cleaning device can prevent the concentric cleaning unevenness from occurring on the substrate.

Incidentally, the order of arrangement in the circumferential direction of the nodule rows n11 to n14 is not limited to the example of FIG. 11, and the nodule rows may be arranged in another order (for instance, in order of nodule row n11, nodule row n13, nodule row n12 and nodule row n14 in circumferential direction).

Fourth Embodiment

Figure 12:
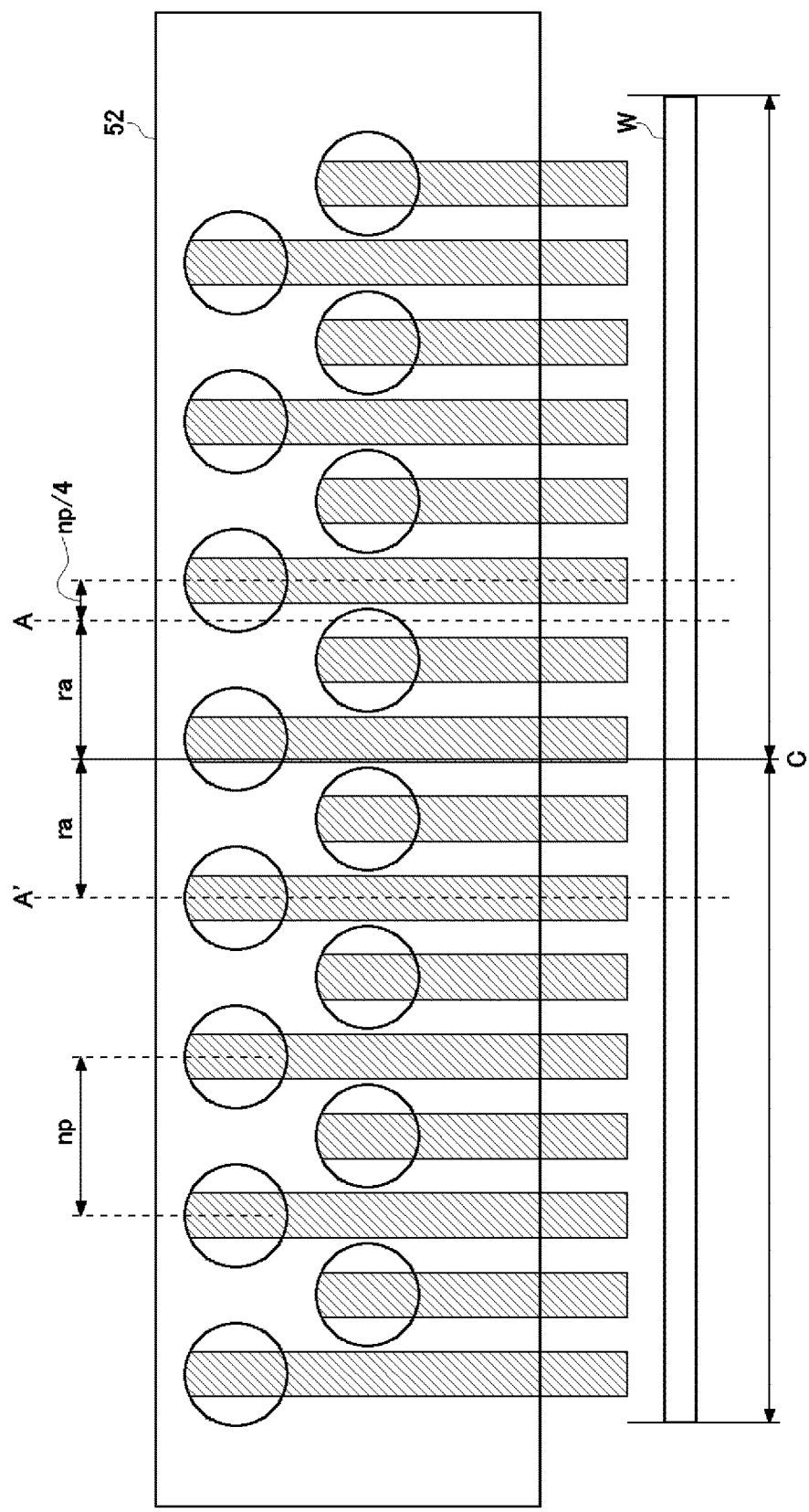
FIG. 12 is a schematic view showing a structure of an upper roll cleaning member in a fourth embodiment of the present invention.

FIG. 12 is a schematic view showing a structure of an upper roll cleaning member 52 in a fourth embodiment. Also in FIG. 12, each of the nodules is largely drawn as compared to the whole size of the upper roll cleaning member. In addition, also in FIG. 12, only a part of a plurality of nodules that are formed on the upper roll cleaning member is shown, and the illustration of a part of the nodules in the row direction and the circumferential direction is omitted.

The nodules on the upper roll cleaning member 52 of the present embodiment are arranged so as not to be symmetric in the longitudinal direction with reference to a position C corresponding to the center of the substrate W. Due to thus formed structure, the high cleaning force regions of the nodules in one side than the position (reference position) corresponding to the rotation center of the substrate W of the upper roll cleaning member 52 and the high cleaning force regions of the nodules in the other side deviate from each other, and the cleaning device can prevent or alleviate the cleaning unevenness. Specifically, even though the surface of the substrate W is in a radius position in which the substrate W is not brought in contact with the high cleaning force region of the nodules, when being brought in slidable contact with the one side of the upper roll cleaning member 52 and being scrub cleaned, the surface of the substrate W results in coming in contact with the high cleaning force regions of the nodules, when the substrate W makes a half turn to thereby come in slidable contact with the opposite side of the upper roll cleaning member 52 and is scrub cleaned. Therefore, also by the upper roll cleaning member 52 of the present embodiment, the trajectories of high cleaning force regions result in being present without a gap in the radial direction of the substrate W, and the cleaning device can prevent the concentric cleaning unevenness from occurring on the substrate.

Specifically, the nodules on the upper roll cleaning member 52 are arranged so that if the middle of the high cleaning force regions of the nodules is positioned in a position A which is distant from the position C in one side (right side in example of FIG. 12) of the longitudinal direction only by a distance ra, the middle of the gaps between the adjacent high cleaning force regions is positioned in a position A' which is distant in the opposite side (left side in example of FIG. 12) only by a distance ra. In other words, distances between the plurality of nodules in one side of the longitudinal direction than the reference position of the upper roll cleaning member 52 and the reference position deviate only by np/4 from distances between the plurality of nodules in the other side of the longitudinal direction than the reference position and the reference position. Thereby, the middles of the trajectories of the high cleaning force regions by the nodules in the other side than the reference position of the longitudinal direction of the upper roll cleaning member 52 can be positioned in the middles of the gaps between the trajectories of the high cleaning force regions by the nodules in one side.

Fifth Embodiment

Figure 13:
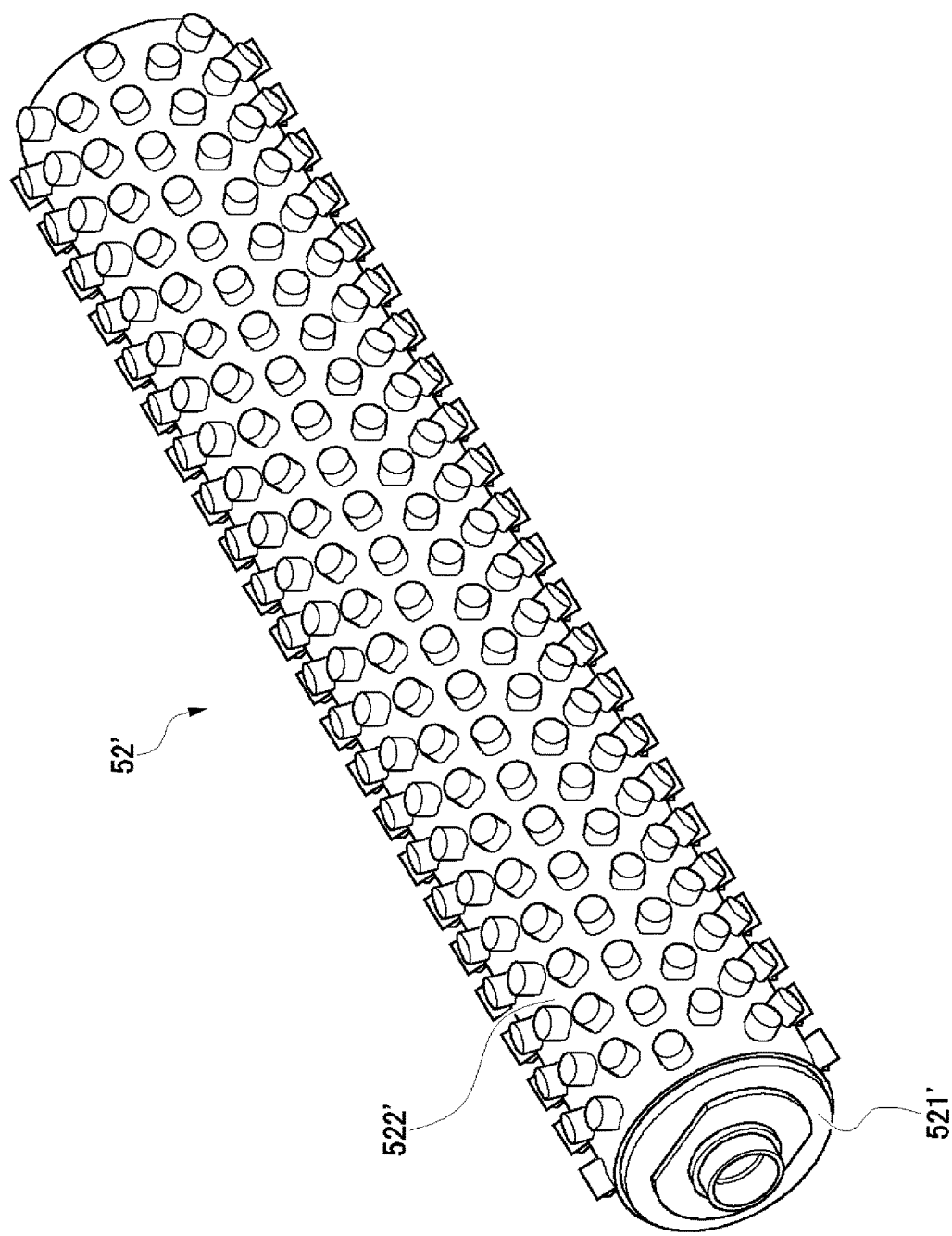
FIG. 13 is a perspective view of a conventional upper roll cleaning member.
Figure 14:
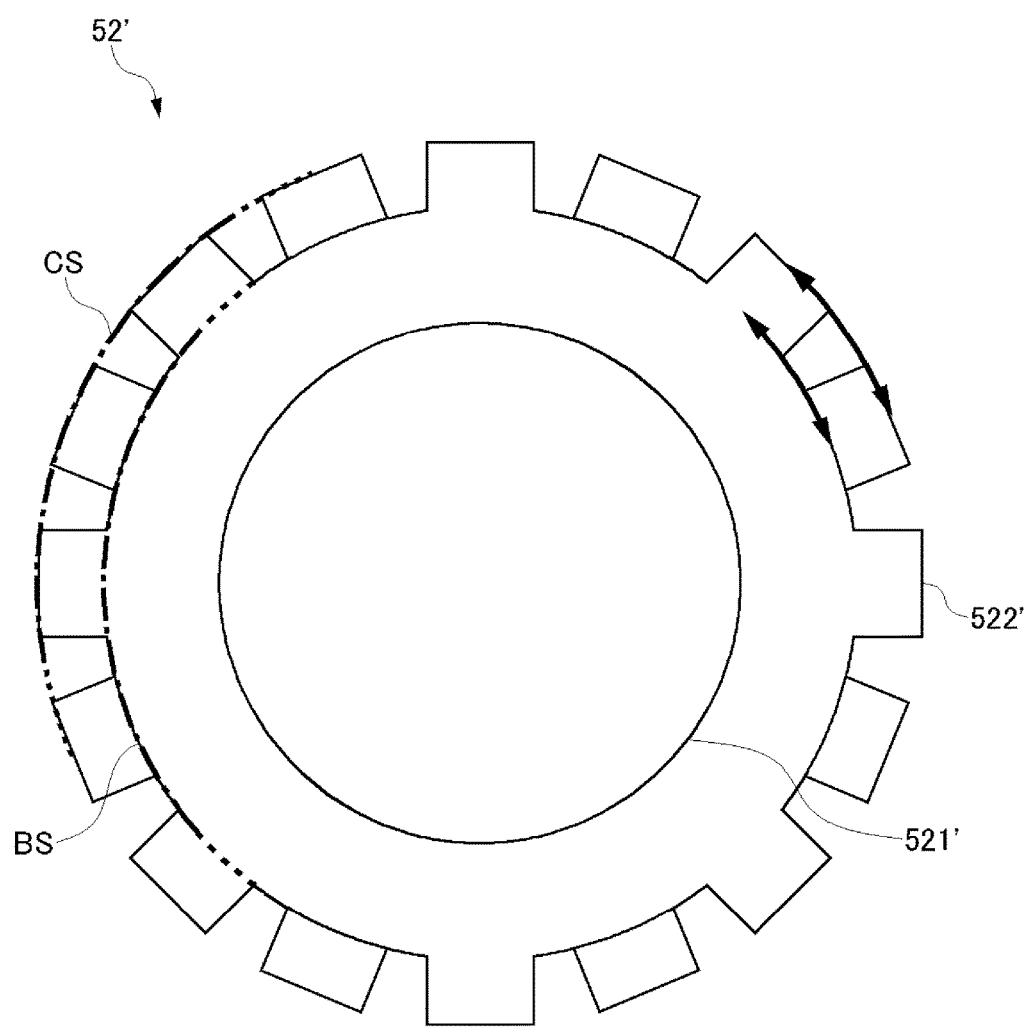
FIG. 14 is a cross-sectional view of the conventional upper roll cleaning member.
Figure 15:
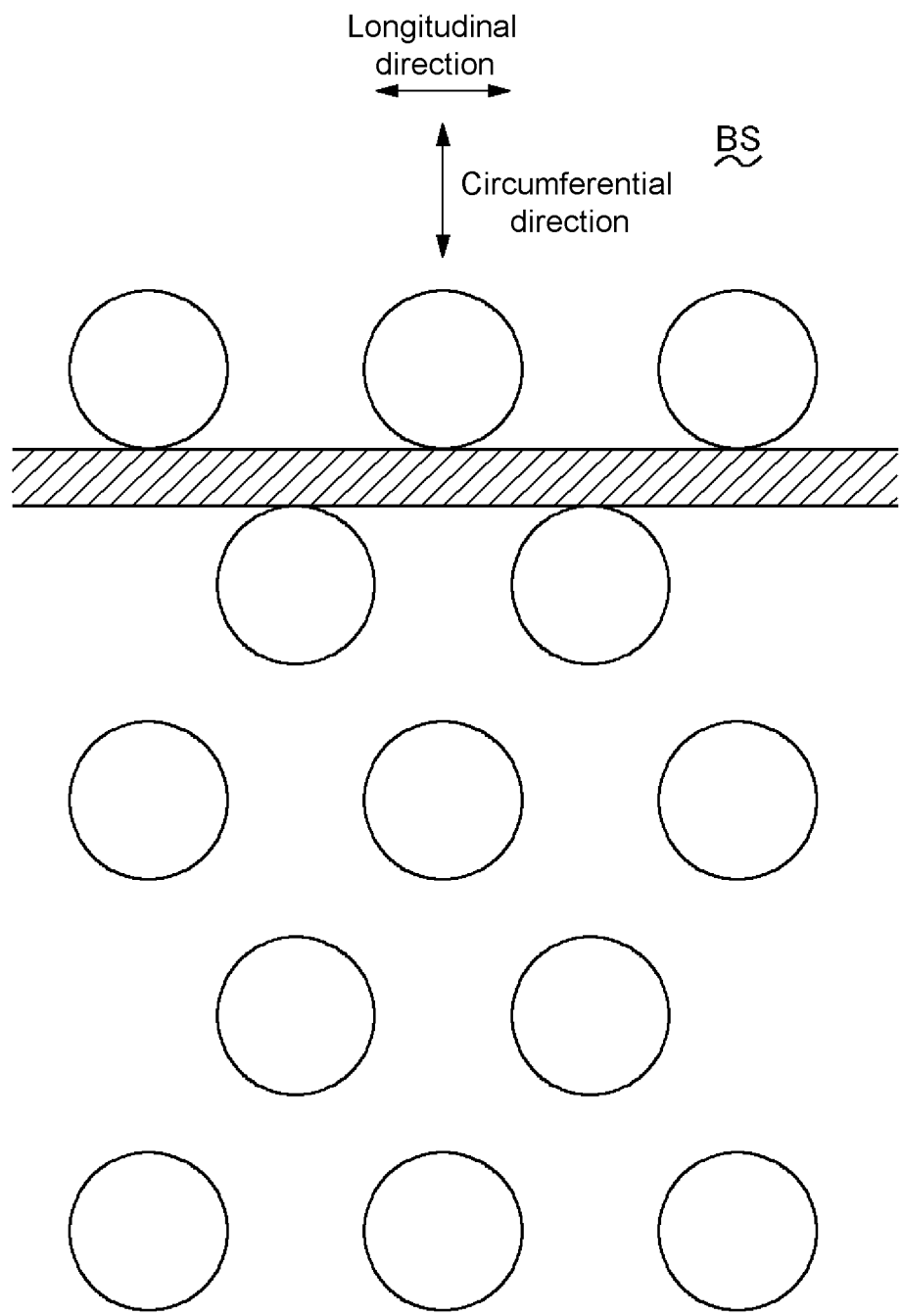
FIG. 15 is a development view of the conventional upper roll cleaning member on a basic surface.
Figure 16:
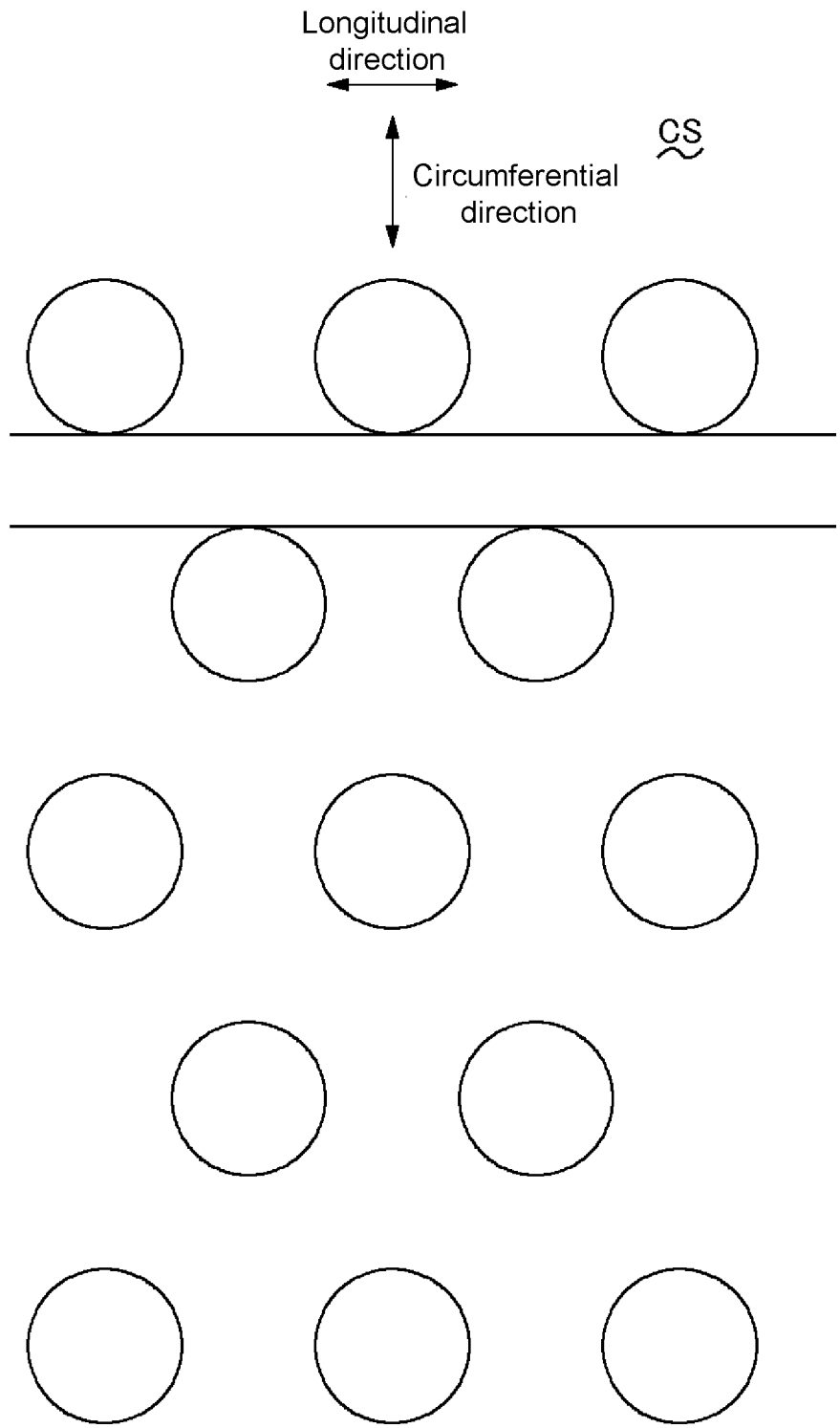
FIG. 16 is a development view of the conventional upper roll cleaning member on a contact surface.

FIG. 13 to FIG. 16 are views showing conventional roll cleaning members; FIG. 13 is a perspective view; FIG. 14 is a cross-sectional view; FIG. 15 is a development view on a basic surface; and FIG. 16 is a development view on a contact surface. Incidentally, in FIG. 15 and FIG. 16, the horizontal directions of the Figures show the longitudinal directions of the roll cleaning members, and the vertical directions of the Figures show the circumferential directions of the roll cleaning members.

As shown in FIG. 14, the upper roll cleaning member 52' is formed of a core material 521' that has a cylindrical shape, and a scrub member 522' with which the surface of the core material 521' is covered. The scrub member 522' is formed from PVA or the like, and a plurality of nodules are formed on the surface thereof. Hereafter, as is shown in FIG. 14, the surface on which the nodules are not formed in the scrub member 522' is referred to as a basic surface BS, and the surface formed of the head of the nodules is referred to as a contact surface CS. As is shown in FIG. 14, the nodules are provided on the basic surface BS of the scrub member 522' so as to protrude.

As is shown in FIG. 14, a distance L1 in the circumferential direction between the nodules in the adjacent nodule rows on the basic surface BS is smaller than a distance L2 in the circumferential direction between the nodules of the adjacent nodule rows on the contact surface CS. In a conventional nodule cleaning member 52', as is shown in FIG. 16, the nodules of the adjacent nodule rows on the contact surface CS are separated from each other in the circumferential direction, and thereby the flowability of the cleaning liquid in the spaces between the nodules (fresh cleaning liquid enters spaces between nodules, and old cleaning liquid is discharged from the spaces between nodules) is secured. However, in the conventional nodule cleaning member 52', as is shown in FIG. 15, also on the basic surface BS, the nodules in the adjacent nodule rows are separated from each other in the circumferential direction.

Figure 3:
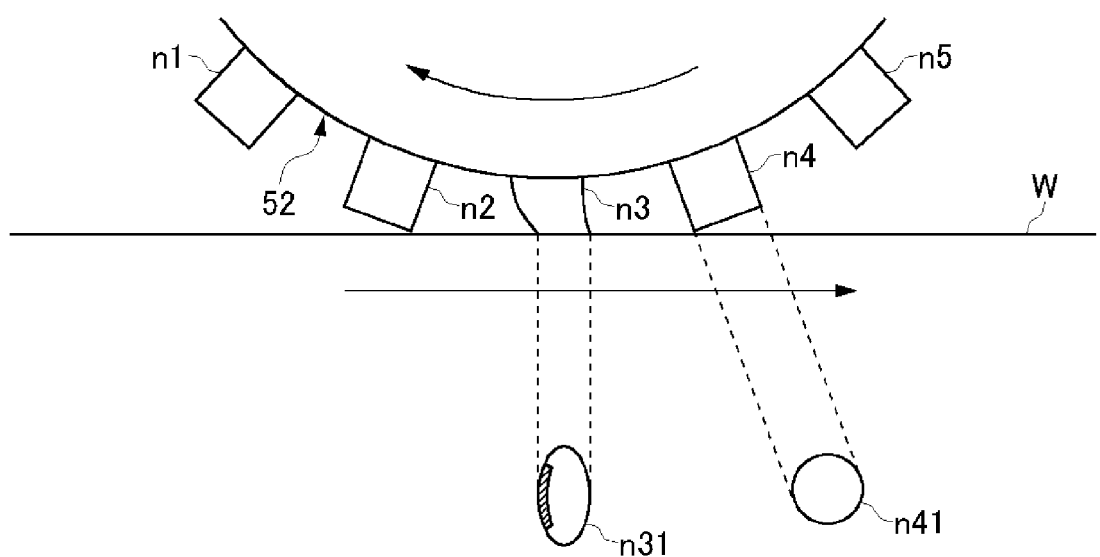
FIG. 3 is a cross-sectional view showing a state in which the nodules contact a surface of a substrate.
Figure 4:
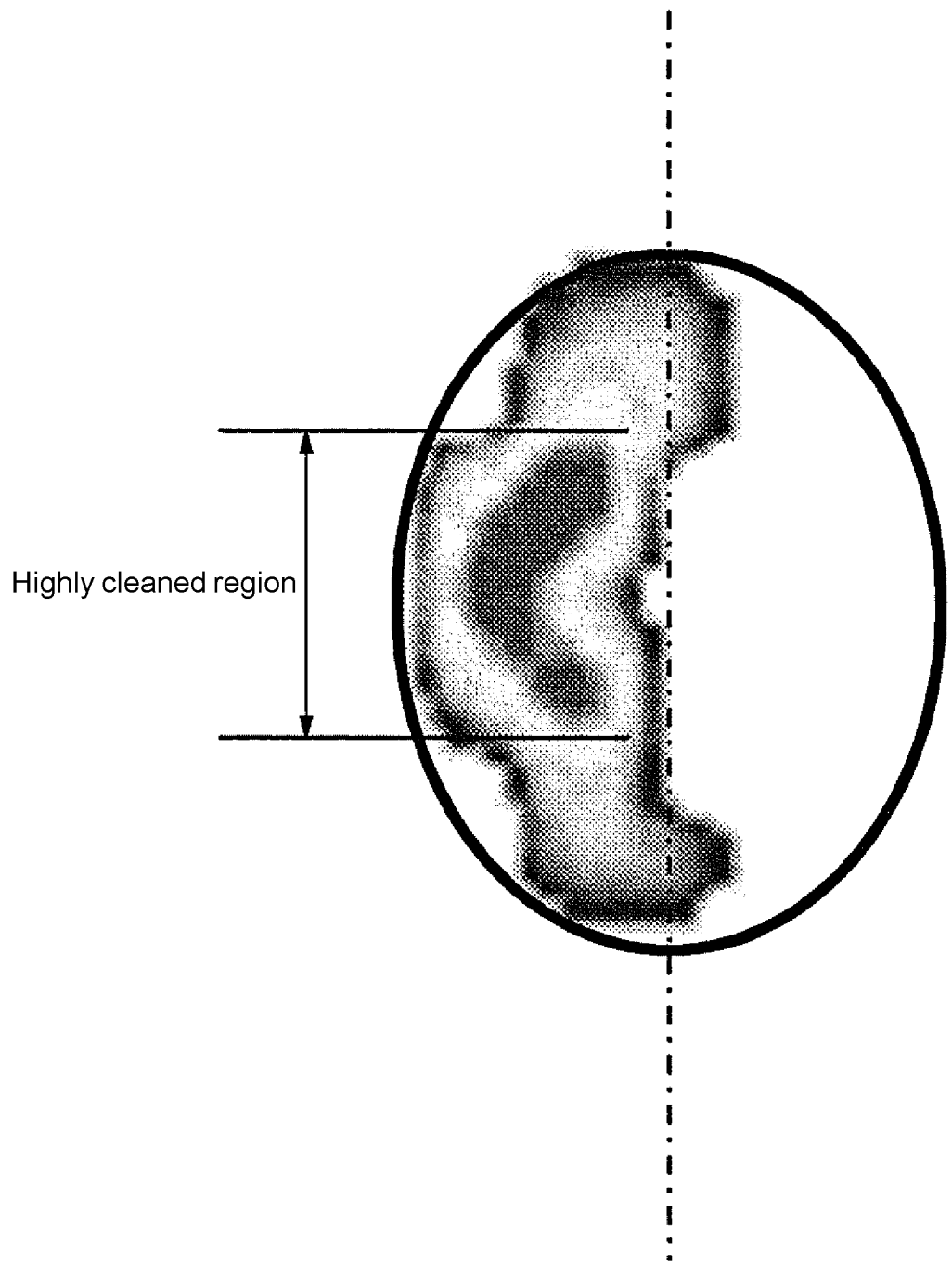
FIG. 4 is a view showing a result of measurement of a pressure distribution on the head of a squashed nodule.
Figure 5:
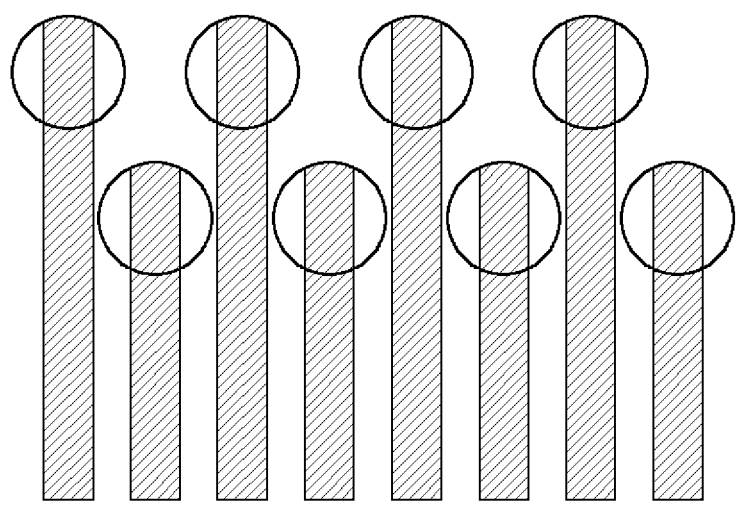
FIG. 5 is a view showing high cleaning force regions.

The nodules which are formed on the roll cleaning member are squashed, receive a stress in the advancing direction of the substrate, and thereby are deformed, when coming in slidable contact with the surface of the substrate, as has been described with reference to FIG. 3. This stress results in being exerted also on a portion of the scrub member 522', on which the nodules are not formed (including vicinity of root of nodules). Specifically, the hatched portion shown in FIG. 15 also results in receiving the stress due to that the nodules comes in slidable contact with the substrate.

The hatched portion in FIG. 15 is a thin-walled portion on which the nodules are not formed, in the scrub member 522'. In FIG. 15, only a part of this thin-walled portion is shown, but this thin-walled portion is formed between each of the nodule rows, in a strip shape. The stress is repeatedly applied to this thin-walled portion and thereby fatigue accumulates in this portion and the portion is deteriorated, which leads to a crack and/or the like.

Then, the present embodiment provides a roll cleaning member which reduces deterioration due to the fatigue while securing the flowability of the cleaning liquid in spaces between the nodules.

Figure 17:
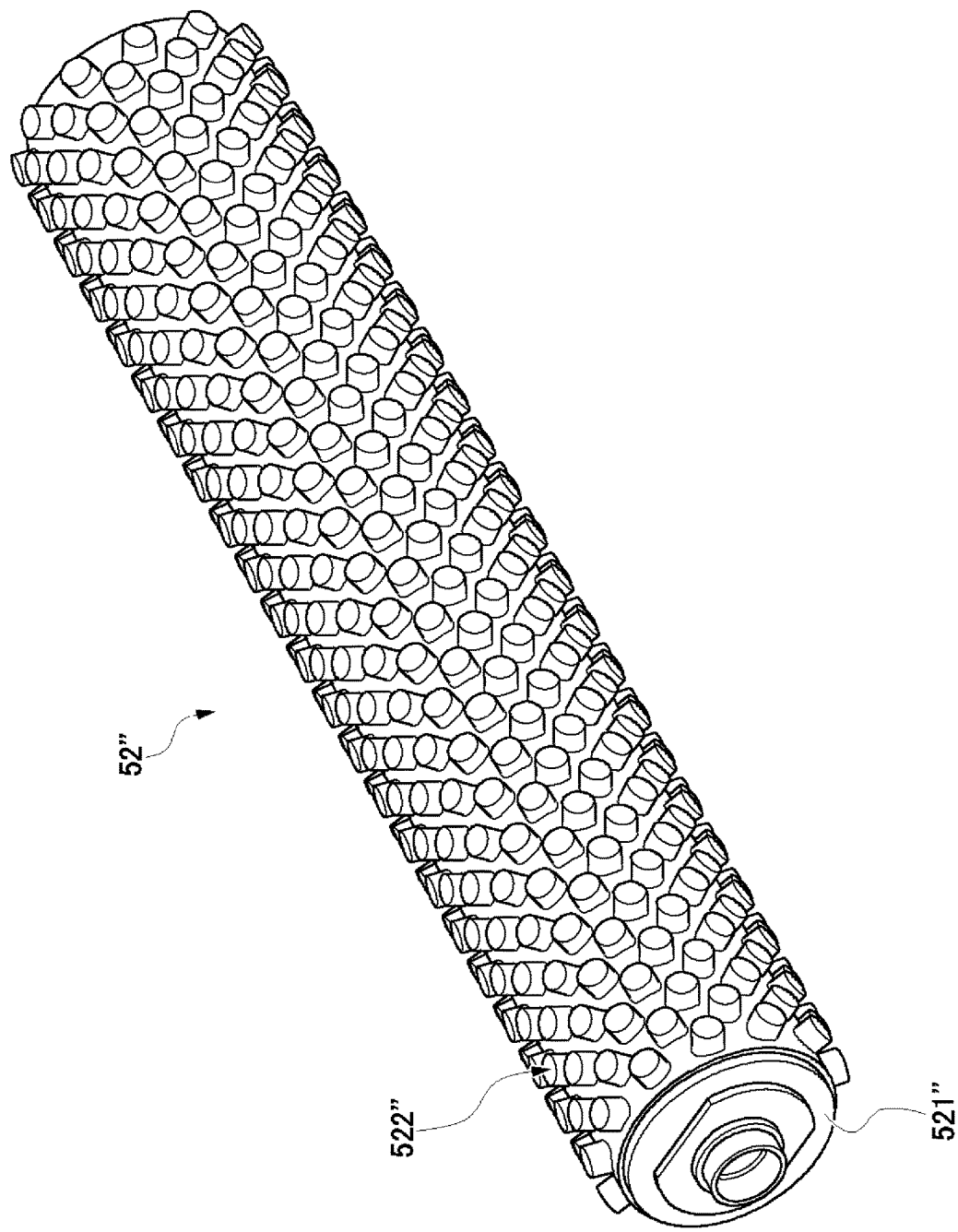
FIG. 17 is a perspective view of an upper roll cleaning member in a fifth embodiment of the present invention.
Figure 18:
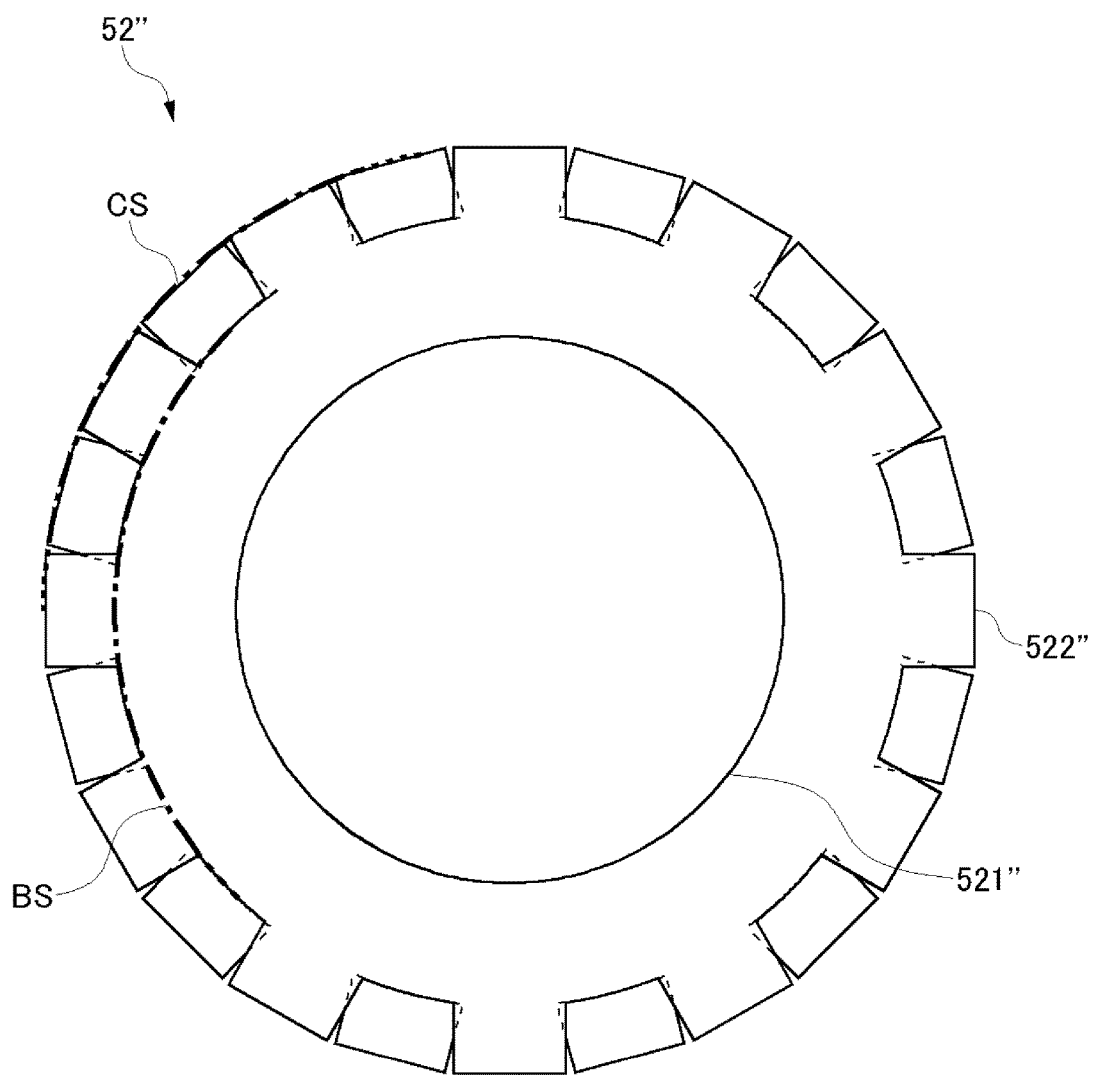
FIG. 18 is a cross-sectional view of the upper roll cleaning member in the fifth embodiment of the present invention.
Figure 19:
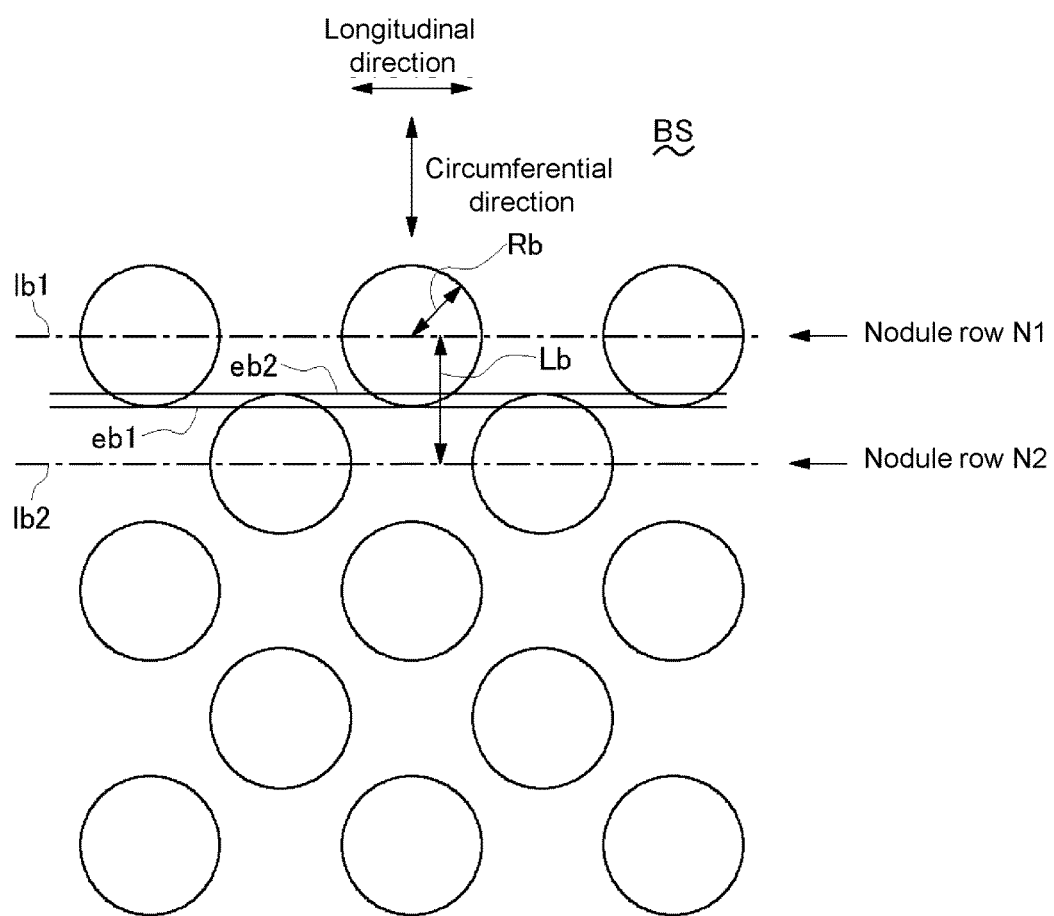
FIG. 19 is a development view of the upper roll cleaning member on the basic surface, in the fifth embodiment of the present invention.
Figure 20:
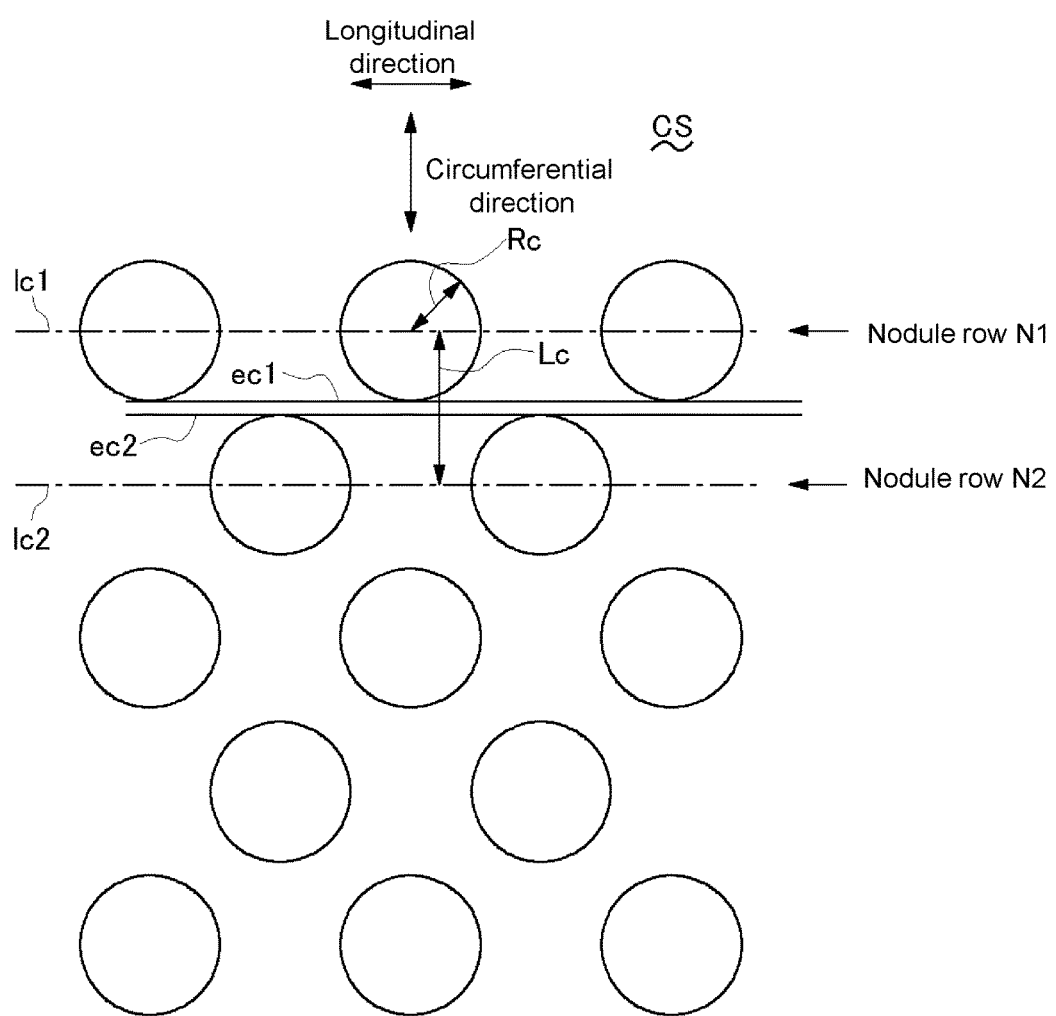
FIG. 20 is a development view of the upper roll cleaning member on the contact surface, in the fifth embodiment of the present invention.

FIG. 17 to FIG. 20 are views showing a roll cleaning member of the present embodiment; FIG. 17 is a perspective view; FIG. 18 is a cross-sectional view; FIG. 19 is a development view on a basic surface; and FIG. 20 is a development view on a contact surface. Incidentally, also in FIG. 19 and FIG. 20, the horizontal directions of the Figures show the longitudinal directions of the roll cleaning members, and the vertical directions of the Figures show the circumferential directions of the roll cleaning members. The upper roll cleaning member 52" is formed of a core material 521" that has a cylindrical shape, and a scrub member 522" with which the surface of the core material 521" is covered. The scrub member 522" is formed from PVA or the like, and a plurality of nodules are formed on the surface thereof.

As is shown in FIG. 17 to FIG. 19, on the upper roll cleaning member 52" in the present embodiment, the nodules are arranged on straight lines at even intervals in the longitudinal direction of the upper roll cleaning member 52", and form a plurality of nodule rows. The positions of the plurality of nodules in the adjacent nodule rows in the circumferential direction of the upper roll cleaning member 52" deviate from each other only by a half of the pitch of the nodules in the nodule row in the longitudinal direction, and partially overlap each other in the circumferential direction on a basic surface BS. Specifically, as is shown in FIG. 19, on the basic surface BS, in a region between a straight line eb1 that connects the outer edges of the respective nodules in the first nodule row N1 and a straight line eb2 that connects the outer edges of the respective nodules in the second nodule row N2, a part of the respective nodules in the first nodule row N1 and a part of the respective nodules in the second nodule row N2 alternately exist. In other words, on the basic surface BS, a plurality of nodules in each of the nodule rows deviate from each other and become staggered in the longitudinal direction between the adjacent nodule rows in the circumferential direction, and partially overlap each other in the circumferential direction. Incidentally, as is shown in FIG. 20, on the contact surface CS, in a region between a straight line ec1 that connects the outer edges of the respective nodules in the first nodule row N1 and a straight line ec2 that connects the outer edges of the respective nodules in the second nodule row N2, a region is formed into a strip shape in the longitudinal direction, in which neither of each nodule in the first nodule row N1 and each nodule in the second nodule row N2 exists.

The above described relationship can be expressed in another way. Specifically, if the relationship will be described while an attention has been paid to two nodule rows which are adjacent to each other, out of each of the plurality of nodule rows aligned on one straight lines in the longitudinal direction, for instance, as is shown in FIG. 20, the shortest distance Lc between (1) a straight line lc1 that passes through centers of circles of the plurality of nodules that constitute the first nodule row N1, and (2) a straight line lc2 that passes through centers of circles of the plurality of nodules which constitute the second nodule row N2 which is adjacent to the first nodule row N1 in the circumferential direction, on the contact surface CS, and a radius Rc of the nodules that constitute the first nodule row N1 and the second nodule row N2 (in FIG. 20, the case of the nodules having the same radius is shown, but when the plurality of nodules having different radii are provided, the average length of the radii of the nodules on the contact surface CS is selected as Rc) are set so as to have a relationship of Lc>2Rc.

On the other hand, as is shown in FIG. 19, the shortest distance Lb between a straight line lb1 that passes through centers of circles of the plurality of nodules which constitute the first nodule row N1, and a straight line lb2 that passes through centers of circles of the plurality of nodules which constitute the second nodule row N2 that is adjacent to the first nodule row N1 in the circumferential direction, on the basic surface BS, a radius Rb of the plurality of nodules that constitute the first nodule row N1 and the second nodule row N2 on the basic surface BS (in FIG. 19, the case of the nodules having the same radius is shown, but when the plurality of nodules having different radii are provided, the average length of the radii of the nodules on the basic surface BS is selected as Rb) are set so as to have a relationship of Lb<2Rb.

Thus, in the upper roll cleaning member 52" in the present embodiment, the spaces between the nodules in the circumferential direction become narrower than those between the conventional upper roll cleaning member 52', and the number of the nodules that come in slidable contact with the surface of the substrate increases more than a conventional one, though having the same number of revolutions; and a cleaning force increases.

Furthermore, it is understood that the upper roll cleaning member 52" in the present embodiment is excellent also in resistance against the fatigue due to the stress as compared to that of the conventional upper roll cleaning member 52'. This is considered to be because in the present embodiment, the nodules in the adjacent nodule rows are arranged so as to partially overlap in the circumferential direction, and a thin-walled portion in which the nodules are not formed in the scrub member 522" does not become a continuous strip shape. In such an arrangement, even though the nodules are deformed when coming in slidable contact with the surface of the substrate, and the stress is exerted on the thin-walled portion, such a portion becomes discontinuous, and the stress due to the nodules that are adjacent in the row direction is dispersed.

On the other hand, as in the above description, a distance between nodules in the circumferential direction on the contact surface CS becomes larger than the distance between nodules in the circumferential direction on the basic surface BS. As a result, in the present embodiment, as has been described above, the nodules in the adjacent nodule rows overlap each other in the circumferential direction on the basic surface BS, but the nodules in the nodule rows which are adjacent to each other in the circumferential direction of the upper roll cleaning member 52" are separated from each other on the contact surface CS, as is shown in FIG. 20. Thereby, the flowability in spaces between the nodules of the cleaning liquid is secured that has been supplied to the surface of the substrate.

As has been described above, the upper roll cleaning member 52" of the present embodiment can enhance a cleaning performance and alleviate the deterioration due to the fatigue, while securing the flowability of the cleaning liquid in spaces between the nodules.

Incidentally, in the above described first to fifth embodiments, the shapes of the nodules have been the column shape, but the shape of the nodule is not limited to the column shape, and may be another shape such as a quadrangular prism shape, for instance. In addition, in the above described first to fourth embodiments, the structure has been described in which the nodules are formed on the upper roll cleaning member 52 and the cleaning device prevents or alleviates the cleaning unevenness that occurs on the upper face of the substrate W, but also in the case where the nodules are formed on the lower roll cleaning member 53, the cleaning device can prevent or alleviate the cleaning unevenness that occurs on the lower face of the substrate W, by having a structure which is similar to the above description. Furthermore, in the above described fifth embodiment, such a structure has been described that the cleaning device has the upper roll cleaning member 52 having the nodules formed thereon, enhances a cleaning performance and can also alleviate the deterioration due to the fatigue, while securing the flowability of the cleaning liquid in spaces between the nodules, but also in the case where the nodules are formed on a lower roll cleaning member 53, the cleaning device can have a structure which is similar to the above description.

The present technology has an effect of being capable of alleviating or preventing the concentric cleaning unevenness that occurs on the substrate, because the substrate is cleaned so that the high cleaning force regions of the nodules are present without a gap in the radial direction of the substrate, and is useful as a roll cleaning member that comes in contact with the surface of the substrate to clean the substrate, as a cleaning device provided with the same, and the like.

Preferred embodiments of the present invention have been described above, which are presently considered, but the present embodiments can be variously modified, and the attached claims are intended to include all of such modifications in the true spirit and the scope of the present invention.

REFERENCE SIGNS LIST

50 Roll cleaning device
51 Spindle
51*a* Top
52 Upper roll cleaning member
521 First upper roll cleaning member
522 Second upper roll cleaning member
52', 52" Upper roll cleaning member 521', 521" Core material
522', 522" Scrub member
53 Lower roll cleaning member
54 Cleaning liquid supply nozzle
55 Cleaning liquid supply nozzle
nw Diameter of nodule
np Pitch in arrangement in row direction of nodules
sa Width of high cleaning force region in row direction
sp Oscillation pitch (amplitude of reciprocal parallel movement)
BS Basic surface
CS Contact surface

The invention claimed is:

1. A cleaning device comprising:
a substrate support member that supports and rotates a substrate; and
a first roll cleaning member and a second roll cleaning member, each of which is a roll cleaning member for scrub cleaning a surface of the substrate which is rotated by the substrate support member, while rotating, wherein
the roll cleaning member has a plurality of protruding members provided thereon which are arrayed in the longitudinal direction thereof, and slidably contact the surface of the substrate,
cleans the substrate so that the trajectories of high cleaning force regions out of the parts of the protruding members which come in slidable contact with the substrate are present without a gap in a radial direction of the substrate, and
in the first roll cleaning member and the second roll cleaning member, the plurality of protruding members are arranged at even intervals in the longitudinal directions of the roll cleaning members and form a plurality of protruding member rows, and the positions of the plurality of protruding members in the protruding member rows adjacent to each other in the circumferential direction of the roll cleaning member deviate from each other only by a half of the pitch of the protruding members in the protruding member rows, wherein
in the first roll cleaning member and the second roll cleaning member, when the pitches of the protruding members in the protruding member rows are represented by np, the positions of the plurality of protruding members of the first roll cleaning member at the time when cleaning the substrate and the positions of the plurality of protruding members of the second roll cleaning member at the time when cleaning the substrate deviate from each other only by np/4 in the row direction.

2. A cleaning device comprising:
a substrate support member that supports and rotates a substrate; and
a roll cleaning member for scrub cleaning a surface of the substrate which is rotated by the substrate support member, while rotating, wherein
the roll cleaning member has a plurality of protruding members provided thereon which are arrayed in the longitudinal direction thereof, and slidably contact the surface of the substrate, and
cleans the substrate so that the trajectories of high cleaning force regions out of the parts of the protruding members which come in slidable contact with the substrate are present without a gap in a radial direction of the substrate, wherein
the plurality of protruding members include a plurality of protruding members that are aligned at a pitch np in a first row of the longitudinal direction, a plurality of protruding members that are aligned at the pitch np in a second row of the longitudinal direction, a plurality of protruding members that are aligned at the pitch np in a third row of the longitudinal direction, and a plurality of protruding members that are aligned at the pitch np in a fourth row of the longitudinal direction; and
the positions of the plurality of protruding members in the longitudinal direction, which are aligned in the first row, and the positions of the plurality of protruding members in the longitudinal direction, which are aligned in the second row, deviate from each other only by np/4, the positions of the plurality of protruding members in the longitudinal direction, which are aligned in the second row, and the positions of the plurality of protruding members in the longitudinal direction, which are aligned in the third row, deviate from each other only by np/4, and the positions of the plurality of protruding members in the longitudinal direction, which are aligned in the third row, and the positions of the plurality of protruding members in the longitudinal direction, which are aligned in the fourth row, deviate from each other only by np/4.

3. A cleaning device comprising:
a substrate support member that supports and rotates a substrate; and
a roll cleaning member for scrub cleaning a surface of the substrate which is rotated by the substrate support member, while rotating, wherein
the roll cleaning member has a plurality of protruding members provided thereon which are arrayed in the longitudinal direction thereof, and slidably contact the surface of the substrate, and
cleans the substrate so that the trajectories of high cleaning force regions out of the parts of the protruding members which come in slidable contact with the substrate are present without a gap in a radial direction of the substrate, wherein
the roll cleaning member comes in slidable contact with the substrate in a range that passes the rotation center of a rotating substrate and reaches the outer peripheries of the substrate on both sides from the rotation center, and the plurality of protruding members are asymmetrically arranged on both sides with reference to the position corresponding to the rotation center, wherein
as for the plurality of protruding members, distances between the position corresponding to the rotation center and the plurality of protruding members in one side in the longitudinal direction than the position corresponding to the rotation center, and distances between the position corresponding to the rotation center and the plurality of protruding members in the other side in the longitudinal direction than the position corresponding to the rotation center deviate from each other only by np/4.

4. A cleaning device comprising:
a substrate support member that supports and rotates a substrate; and
a roll cleaning member for scrub cleaning a surface of the substrate which is rotated by the substrate support member, while rotating, wherein
the roll cleaning member has a plurality of protruding members provided thereon which are arrayed in the longitudinal direction thereof, and slidably contact the surface of the substrate, and the plurality of protruding members include a plurality of protruding members that are aligned at a pitch np in a first row of the longitudinal direction, a plurality of protruding members that are aligned at the pitch np in a second row of the longitudinal direction, a plurality of protruding members that are aligned at the pitch np in a third row in the longitudinal direction, and a plurality of protruding members that are aligned at the pitch np in a fourth row of the longitudinal direction, wherein the positions of the plurality of protruding members in the longitudinal direction, which are aligned in the first row, and the positions of the plurality of protruding members in the longitudinal direction, which are aligned in the second row, deviate from each other only by np/4, the positions of the plurality of protruding members in the longitudinal direction, which are aligned in the second row, and the positions of the plurality of protruding members in the longitudinal direction, which are aligned in the third row, deviate from each other only by np/4, and the positions of the plurality of protruding members in the longitudinal direction, which are aligned in the third row, and the positions of the plurality of protruding members in the longitudinal direction, which are aligned in the fourth row, deviate from each other only by np/4.

5. A cleaning device comprising:
a substrate support member that supports and rotates a substrate; and
a roll cleaning member for scrub cleaning a surface of the substrate which is rotated by the substrate support member, while rotating, wherein
the roll cleaning member has a plurality of protruding members provided thereon which are arrayed in the longitudinal direction thereof, and slidably contact the surface of the substrate, and
the plurality of protruding members are arranged in the longitudinal direction of the roll cleaning member to form a plurality of protruding member rows, and positions of the plurality of protruding members in the protruding member rows which are adjacent to each other in the circumferential direction of the roll cleaning member deviate from each other in the longitudinal direction; and
as for the roll cleaning member, the plurality of protruding members in the protruding member rows which are adjacent to each other in the circumferential direction partially overlap each other in the circumferential direction, on a basic surface on which the protruding members are provided so as to protrude, and the plurality of protruding members in the protruding member rows which are adjacent to each other in the circumferential direction are separated from each other in the circumferential direction, on the contact surface of the protruding members.

6. A roll cleaning member for scrub cleaning a surface of a rotating substrate while rotating, comprising:
a plurality of protruding members that are arrayed in the longitudinal direction of the roll cleaning member and slidably contact the surface of the substrate, wherein
the plurality of protruding members include a plurality of protruding members that are aligned at a pitch np in a first row of the longitudinal direction, a plurality of protruding members that are aligned at the pitch np in a second row of the longitudinal direction, a plurality of protruding members that are aligned at the pitch np in a third row of the longitudinal direction, and a plurality of protruding members that are aligned at the pitch np in a fourth row of the longitudinal direction; and the positions of the plurality of protruding members in the longitudinal direction, which are aligned in the first row, and the positions of the plurality of protruding members in the longitudinal direction, which are aligned in the second row, deviate from each other only by np/4, the positions of the plurality of protruding members in the longitudinal direction, which are aligned in the second row, and the positions of the plurality of protruding members in the longitudinal direction, which are aligned in the third row, deviate from each other only by np/4, and the positions of the plurality of protruding members in the longitudinal direction, which are aligned in the third row, and the positions of the plurality of protruding members in the longitudinal direction, which are aligned in the fourth row, deviate from each other only by np/4.

7. A roll cleaning member for scrub cleaning a surface of a rotating substrate while rotating, comprising:
a plurality of protruding members that are arrayed in the longitudinal direction of the roll cleaning member and slidably contact the surface of the substrate, wherein
the plurality of protruding members are arranged in the longitudinal direction of the roll cleaning member to form a plurality of protruding member rows, and positions of the plurality of protruding members in the protruding member rows which are adjacent to each other in the circumferential direction of the roll cleaning member deviate from each other in the longitudinal direction; and
as for the roll cleaning member, the plurality of protruding members in the protruding member rows which are adjacent to each other in the circumferential direction partially overlap each other in the circumferential direction, on a basic surface on which the protruding members are provided so as to protrude, and the plurality of protruding members in the protruding member rows which are adjacent to each other in the circumferential direction are separated from each other in the circumferential direction, on the contact surface of the protruding members.

8. A roll cleaning member for cleaning a surface of a rotating substrate, comprising:
a plurality of protruding members provided thereon that slidably contact a surface of the substrate and have a tubular shape, wherein
the plurality of protruding members are arrayed so as to form a plurality of protruding member rows that are arrayed on straight lines in the longitudinal direction of the roll cleaning member, and
each of the protruding members that constitute the plurality of protruding member rows is arranged at such a position as to satisfy $Lc > 2Rc$, and $Lb < 2Rb$;

wherein Lc is a shortest distance between a straight line that passes through centers of circles of the plurality of protruding members that constitute a first protruding member row and a straight line that passes through centers of circles of the plurality of protruding members that constitute a second protruding member row which is adjacent to the first protruding member row in the circumferential direction, on a contact surface of the protruding member;

Rc is an average length of radii of the plurality of protruding members that constitute the first protruding member rows, on the contact surface of the protruding member;

Lb is a shortest distance between a straight line that passes through centers of circles of a plurality of protruding members that constitute a plurality of protruding member rows and a straight line that passes through centers of circles of a plurality of protruding members that constitute a second protruding member row that is adjacent to the first protruding member row in the circumferential direction, on a basic surface on which the protruding members are provided so as to protrude; and Rb is an average length of radii of a plurality of protruding members that constitute a plurality of protruding member rows, on the basic surface on which the protruding members are provided so as to protrude.

* * * * *